United States Patent
Ng et al.

(10) Patent No.: US 10,855,233 B2
(45) Date of Patent: Dec. 1, 2020

(54) APPARATUS AND METHOD FOR POWER AMPLIFIER SURGE PROTECTION

(71) Applicant: Skyworks Solutions, Inc., Irvine, CA (US)

(72) Inventors: Wendy Ng, Los Gatos, CA (US); Wei Long, Milpitas, CA (US); Kevin Cho, Santa Clara, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 236 days.

(21) Appl. No.: 16/044,410

(22) Filed: Jul. 24, 2018

(65) Prior Publication Data

US 2019/0036495 A1    Jan. 31, 2019

Related U.S. Application Data

(60) Provisional application No. 62/694,826, filed on Jul. 6, 2018, provisional application No. 62/536,910, filed on Jul. 25, 2017.

(51) Int. Cl.

| | |
|---|---|
| H03F 1/52 | (2006.01) |
| H03F 3/213 | (2006.01) |
| H03F 3/195 | (2006.01) |
| H03F 3/24 | (2006.01) |
| H02M 1/32 | (2007.01) |
| H02M 3/07 | (2006.01) |

(Continued)

(52) U.S. Cl.
CPC ............... *H03F 1/52* (2013.01); *H02M 1/32* (2013.01); *H03F 3/195* (2013.01); *H03F 3/213* (2013.01); *H03F 3/245* (2013.01); *H02M 3/07* (2013.01); *H02M 2001/0006* (2013.01); *H02M 2001/008* (2013.01); *H02M 2001/325* (2013.01); *H03F 2200/426* (2013.01); *H03F 2200/451* (2013.01); *H04B 1/3888* (2013.01)

(58) Field of Classification Search
CPC . H03F 1/25; H03F 3/192; H03F 3/213; H03F 3/245; H03F 2200/426; H03F 2200/451; H02M 1/32; H02M 3/07; H02M 2001/0006; H02M 2001/008; H02M 2001/325; H04B 1/3888
USPC ........................................................ 361/86
See application file for complete search history.

(56) References Cited

U.S. PATENT DOCUMENTS

| | | | |
|---|---|---|---|
| 8,542,061 B2 * | 9/2013 | Levesque .............. | H03F 1/0227 327/536 |
| 2009/0016085 A1 * | 1/2009 | Rader ..................... | H02M 3/07 363/79 |
| 2014/0009220 A1 * | 1/2014 | Jiang ...................... | H02M 3/07 327/536 |

* cited by examiner

*Primary Examiner* — Kevin J Comber
(74) *Attorney, Agent, or Firm* — Knobbe, Martens, Olson & Bear, LLP

(57) ABSTRACT

Components of a power amplifier controller may support lower voltages than the power amplifier itself. As a result, a surge protection circuit that prevents a power amplifier from being damaged due to a power surge may not effectively protect the power amplifier controller. Embodiments disclosed herein present an overvoltage protection circuit that prevents a charge-pump from providing a voltage to a power amplifier controller during a detected surge event. By separately detecting and preventing a voltage from being provided to the power amplifier controller during a surge event, the power amplifier controller can be protected regardless of whether the surge event results in a voltage that may damage the power amplifier. Further, embodiments of the overvoltage protection circuit can prevent a surge voltage from being provided to a power amplifier operating in 2G mode.

17 Claims, 14 Drawing Sheets

(51) Int. Cl.
*H02M 1/00* (2006.01)
*H04B 1/3888* (2015.01)

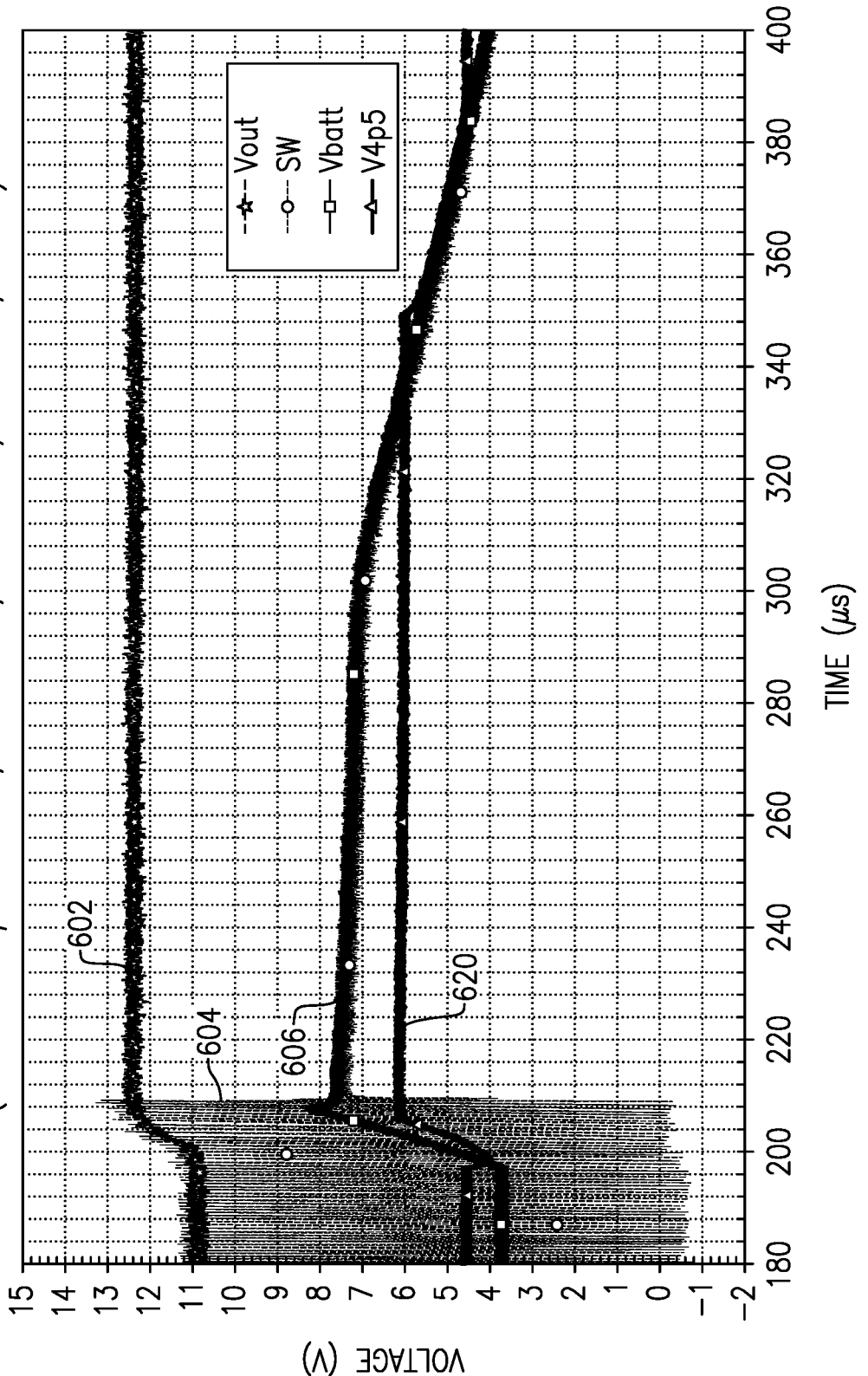

APPARATUS AND METHOD FOR POWER AMPLIFIER SURGE PROTECTION

INCORPORATION BY REFERENCE TO ANY PRIORITY APPLICATIONS

This application claims priority to U.S. Provisional Application No. 62/694,826, which was filed on Jul. 6, 2018 and is titled "APPARATUS AND METHOD FOR POWER AMPLIFIER SURGE PROTECTION;" and U.S. Provisional Application No. 62/536,910, which was filed on Jul. 25, 2017 and is titled "APPARATUS AND METHOD FOR POWER AMPLIFIER SURGE PROTECTION," the disclosures of which are expressly incorporated by reference herein in their entirety for all purposes. Further, this application is being filed on Jul. 24, 2018, the same date as U.S. application Ser. No. 16/044,298, which is titled "APPARATUS AND METHOD FOR SURGE PROTECTION OF A CHARGE-PUMP POWERED POWER AMPLIFIER" and is hereby expressly incorporated by reference herein in its entirety for all purposes. Any and all applications, if any, for which a foreign or domestic priority claim is identified in the Application Data Sheet of the present application are hereby incorporated by reference in their entireties under 37 CFR 1.57.

BACKGROUND

Technical Field

This disclosure relates to overvoltage protection for a power amplifier module. More specifically, this disclosure relates to overvoltage protection for a power amplifier controller of a power amplifier.

Description of Related Technology

Wireless devices, such as cellphones, typically use one or more power amplifiers to amplify an information signal prior to transmission. Often, a power amplifier will be included as part of a power amplifier module that also includes a power amplifier controller for controlling a power amplifier. For example, the power amplifier controller may configure a bias circuit of the power amplifier based on an operating mode of the wireless device.

It is not uncommon for a power surge event to occur that can cause a sudden increase in a voltage supplied to elements of the wireless device, including to the power amplifier module. For example, a power surge event may occur when a user connects the wireless device to an electrical outlet or a building's electrical grid so as to charge the battery of the wireless device. The power surge event can often cause damage to elements or components of the wireless device including to components of the power amplifier module.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to a power management integrated circuit. The power management integrated circuit may include a boost converter configured to supply a first voltage to a power amplifier. The power amplifier may be configured to support a first maximum voltage. The power management integrated circuit may further include a charge-pump circuit configured to supply a second voltage to a power amplifier controller of the power amplifier. The power amplifier controller may be configured to support a second maximum voltage. The second maximum voltage may be less than the first maximum voltage. In addition, the power management integrated circuit may include an overvoltage protection circuit that, when a power surge event occurs, configures the charge-pump circuit with a surge-protection configuration preventing the second voltage from exceeding the second maximum voltage.

Other aspects of the present disclosure relate to a wireless device. The wireless device may include a power amplifier module that can include a power amplifier configured to support a first maximum voltage and a power amplifier controller configured to bias the power amplifier and to support a second maximum voltage that is less than the first maximum voltage. The wireless device may further include a power management integrated circuit that can include a boost converter, a charge-pump circuit, and an overvoltage protection circuit. The boost converter may be configured to supply a first voltage to the power amplifier. The charge-pump circuit may be configured to supply a second voltage to the power amplifier controller. The overvoltage protection circuit may be configured to prevent the second voltage from exceeding the second maximum voltage during a power surge event by configuring the charge-pump circuit with a surge-protection configuration when the power surge event occurs.

Additional aspects of the present disclosure relate to a method of performing surge protection of a wireless device. The method may include determining, by a power management integrated circuit, an operating mode of the wireless device. The power management integrated circuit may include a boost converter configured to supply a first voltage to a power amplifier of a power amplifier module. The method may further include determining a first overvoltage protection threshold of a charge-pump circuit based at least in part on the operating mode of the wireless device. The charge-pump circuit may be configured to supply a second voltage to a power amplifier controller of the power amplifier module. In addition, the method may include determining a first input voltage supplied to the power management integrated circuit of the wireless device at a first time period; determining that the first input voltage exceeds the first overvoltage protection threshold; and configuring the charge-pump circuit with a surge-protection configuration responsive to determining that the first input voltage exceeds the first overvoltage protection threshold.

Certain aspects of the present disclosure relate to a power management integrated circuit. The power management integrated circuit may include a charge-pump circuit configured to supply a charge-pump voltage to a power amplifier controller of a power amplifier; a boost converter configured to supply a boost voltage to the power amplifier when operating in a first mode and to supply the charge-pump voltage to the power amplifier when operating in a second mode; and an overvoltage protection circuit that, when a power surge event occurs during the second mode, can prevent the boost converter from supplying the charge-pump voltage to the power amplifier. Preventing the boost converter from supplying the charge-pump voltage to the power amplifier can prevent the power amplifier from receiving a voltage that exceeds a maximum voltage supported by the power amplifier in the second mode.

Other aspects of the present disclosure relate to a wireless device. The wireless device may include a power amplifier module that can include a power amplifier configured to operate in at least a first mode and a second mode and a power amplifier controller configured to bias the power amplifier. Further, the wireless device can include a power management integrated circuit that may include a charge-pump circuit, a boost converter, and an overvoltage protection circuit. The charge-pump may be configured to supply a charge-pump voltage to the power amplifier controller. The boost converter may be configured to supply a boost voltage to the power amplifier when operating in a first mode and to supply the charge-pump voltage to the power amplifier when operating in a second mode. The overvoltage protection circuit may be configured, when a power surge event occurs during the second mode, to prevent the boost converter from supplying the charge-pump voltage to the power amplifier. Preventing the boost converter from supplying the charge-pump voltage to the power amplifier can prevent the power amplifier from receiving a voltage that exceeds a maximum voltage supported by the power amplifier in the second mode.

Additional aspects of the present disclosure relate to a method of performing surge protection of a wireless device. The method may include determining, by a power management integrated circuit, an operating mode of the wireless device; determining a first overvoltage protection threshold of a power amplifier of a power amplifier module based at least in part on the operating mode of the wireless device; receiving, at a boost converter, a first voltage from a charge-pump circuit of the power management integrated circuit; providing, by the boost converter, a second voltage to the power amplifier, the second voltage based on the first voltage; providing, by the charge-pump circuit, the first voltage to a power amplifier controller of the power amplifier module; determining a first input voltage supplied to the power management integrated circuit of the wireless device at a first time period; determining that the first input voltage exceeds the first overvoltage protection threshold; and configuring the boost converter with a surge-protection configuration responsive to determining that the first input voltage exceeds the first overvoltage protection threshold.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIG. 6B depicts a graph illustrating a result of a power surge on the output of the charge-pump with overvoltage protection and with no load present.

DETAILED DESCRIPTION

Introduction

Figure 1:
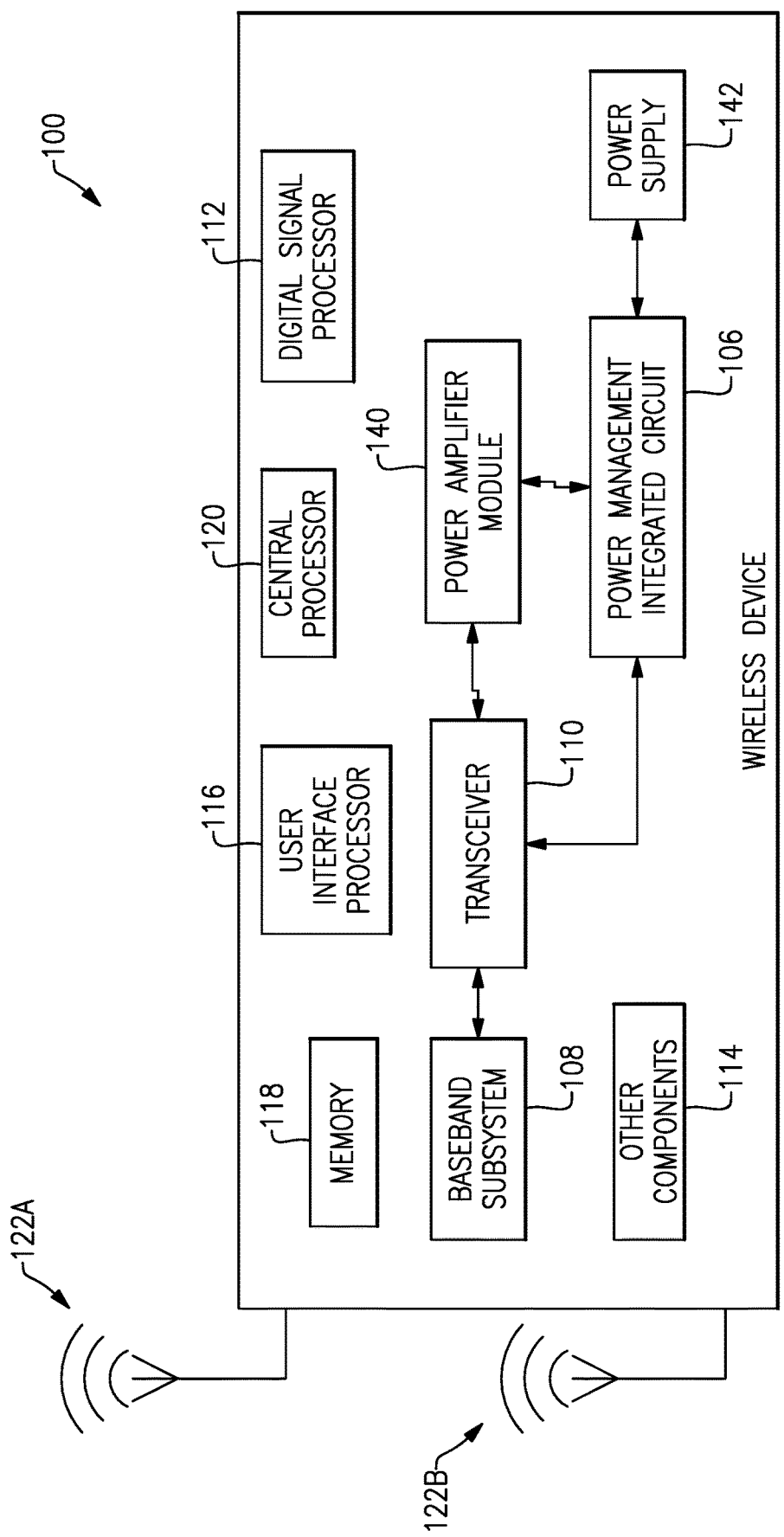
FIG. 1 illustrates a block diagram of an embodiment of a wireless device including a power amplifier module and a power management integrated circuit.

Components of an electronic device, such as a wireless device, are typically designed to work within a particular voltage and/or power range. Usually, the battery or other power supply is configured to output a voltage that is within a range supported by the components of the electronic device. However, particular events may cause the voltage supplied by the battery or other power supply to exceed a supported operating range for components of the electronic device. For example, a power amplifier may be configured to operate in supplied with a voltage of up to 11 or 12 V. A battery may supply voltage of, for example, 3.8 V to a power management integrated circuit, which may use a boost regulator circuit to boost the voltage up to 11 or 12 V. However, during a surge event, such as may occur when the electronic devices plugged into a wall or main power supply for charging, the voltage output by the boost regulator may exceed 13 or 14 V. In some cases, even if the voltage exceeds a component's supported voltage for a brief time, the voltage surge can damage the component.

In certain embodiments, the electronic device, or particular circuits thereof, may include overvoltage protection circuitry within the power management integrated circuit to prevent a voltage supplied to one or more components of the electronic device from exceeding a voltage within which the component can safely operate or exceeding a voltage that the component can safely receive without being damaged. For example, the power management integrated circuit may incorporate an overvoltage protection circuit that prevents the voltage output by the boost regulator circuit from exceeding a voltage that can be supplied to a collector of a power amplifier without damaging the power amplifier.

However, in some cases, the use of an overvoltage protection circuit may be insufficient because some components of the electronic device may have a lower threshold or tolerance for voltage spikes or changes in other components.

In some cases, the voltage threshold at which some components of the electronic device may operate or receive before being damaged may be lower than a normal operating voltage of some other components within the electronic device. For example, although the power amplifier of a wireless device may, in some cases, operate at up to 11 or 12 V, power amplifier control circuitry used to configure the power amplifier may operate at 4.5 V. In some such cases, the power amplifier control circuitry may be damaged if the voltage supply to the power amplifier control circuitry exceeds 6 to 6.5 V. Accordingly, the use of certain existing overvoltage protection circuits may be insufficient for protecting the power amplifier control circuitry. Further, it is often desirable for cost and size constraints as well as for operational performance to use circuit elements in the power amplifier controller that use lower voltages, such as 4.5 volts, instead of elements that can support higher voltages, such as 12 or 13 volts.

Certain embodiments disclosed herein relate to systems and methods for overvoltage protection that is applied to a charge-pump of the power management integrated circuit. The charge-pump of the power management integrated circuit may be used to supply voltage from the power management integrated circuit to the power amplifier controller of a power amplifier module. The overvoltage protection circuit disclosed herein may be used to prevent the voltage supplied to the power amplifier controller from exceeding between 6 and 6.7 V. In certain embodiments, a surge event may cause a voltage output by the power management integrated circuit from exceeding a voltage that is supported by the power amplifier controller, but that does not exceed a voltage supported by the power amplifier itself. In some such embodiments, the existing overvoltage protection circuits may not be triggered because the voltage is maintained at a level supported by the power amplifier. Advantageously, in certain embodiments, the overvoltage protection circuit described herein may prevent the voltage from exceeding the voltage supported by the power amplifier controller thereby preventing damage to the power amplifier controller during a surge event.

Example Wireless Device

FIG. 1 illustrates a block diagram of an embodiment of a wireless device 100 including a power amplifier module 140 and a power management integrated circuit 106. Although the wireless device 100 illustrates only one power amplifier module (PAM), it is possible for the wireless device 100 to include a number of PAMs, each of which may be configured the same or differently.

The power amplifier module 140 can include a number of elements. These elements may include, for example, a power amplifier, a power amplifier controller, a reference current circuit, and a bias circuit. Each of these power amplifier module elements may be implemented on the same circuit die. Alternatively, at least some of the elements of the power amplifier module 140 may be implemented on a different circuit die. Advantageously, by implementing elements on a different circuit die, different semiconductor technologies may be used for different circuit elements of the power amplifier module 140. For example, the bias circuit may be implemented using gallium arsenide (GaAs) technology while the reference current circuit may be implemented using silicon (Si).

In some cases, the power amplifier module 140 can receive RF signals from a transceiver 110 that can be configured to generate radio frequency (RF) signals to be amplified and transmitted, and to process received signals. The transceiver 110 is shown to interact with a baseband subsystem 108 that is configured to provide conversion between data and/or voice signals suitable for a user to consume and RF signals suitable for operation of the transceiver 110. The transceiver 110 may also be connected to a power management integrated circuit 106 that is configured to manage power for the operation of the wireless device.

As will be described in more detail herein, the power management integrated circuit 106 may include one or more circuit elements that can modify the voltage supplied to the power management integrated circuit 106 by, for example, a power supply 142. The power management integrated circuit 106 may modify the voltage of the power supply 142 to be within a desired operating range for one or more elements of the wireless device 100. For example, the power management integrated circuit 106 may boost a supplied voltage to a higher voltage for use by a power amplifier of the power amplifier module 140. Further, the power management integrated circuit 106 may include one or more overvoltage protection circuits for preventing the voltage from boosting or increasing beyond a level capable of being processed by one or more circuit elements of the wireless device 100 without damaging the one or more circuit elements.

The power supply 142 may include one or more elements capable of powering the wireless device 100. For example, the power supply 142 may include a battery.

Other connections between the various components of the wireless device 100 are possible, and are omitted from FIG. 1 for clarity of illustration only and not to limit the disclosure. For example, the power management integrated circuit 106 may be electrically connected to the baseband subsystem 108, the digital signal processor 112, or other components 114. As a second example, the baseband subsystem 108 may be connected to a user interface processor 116 that may facilitate input and output of voice and/or data provided to and received from the user. The baseband subsystem 108 can also be connected to a memory 118 that may be configured to store data and/or instructions to facilitate the operation of the wireless device 100, and/or to provide storage of information for the user.

In addition to the aforementioned components, the wireless device 100 may include one or more central processors 120. Each central processor 120 may include one or more processor cores. Further, the wireless device 100 may include one or more antennas 122A, 122B. In some cases, one or more of the antennas of the wireless device 100 may be configured to transmit and receive at different frequencies or within different frequency ranges. Further, one or more of the antennas may be configured to work with different wireless networks. Thus, for example, the antenna 122A may be configured to transmit and receive signals over a 2G network, or a network that implements a 2G communication standard, and the antenna 122B may be configured to transmit and receive signals over a 3G/4G/LTE/HPUE network. LTE may refer to 4G networks that support the Long-Term Evolution standard and HPUE may refer to networks that supper High Power User Equipment. In some cases, the antennas 122A and 122B may both be configured to transmit and receive signals over the same type of network, for example, a 2.5G network, but at different frequencies.

A number of other wireless device configurations can utilize one or more features described herein. For example, a wireless device does not need to be a multi-band device. In another example, a wireless device can include additional antennas such as a diversity antenna, and additional connectivity features such as Wi-Fi, Bluetooth, and GPS. Further, the wireless device 100 may include any number of additional components, such as analog to digital converters, digital to analog converters, graphics processing units, solid state drives, etc. Moreover, the wireless device 100 can include any type of device that may communicate over one or more wireless networks and that may include a power amplifier module 140. For example, the wireless device 100 may be a cellular phone, including a smartphone or a dumbphone, a tablet, a laptop, smart glasses, a video game device, a smart appliance, etc.

Example PMIC and PA

Figure 2:
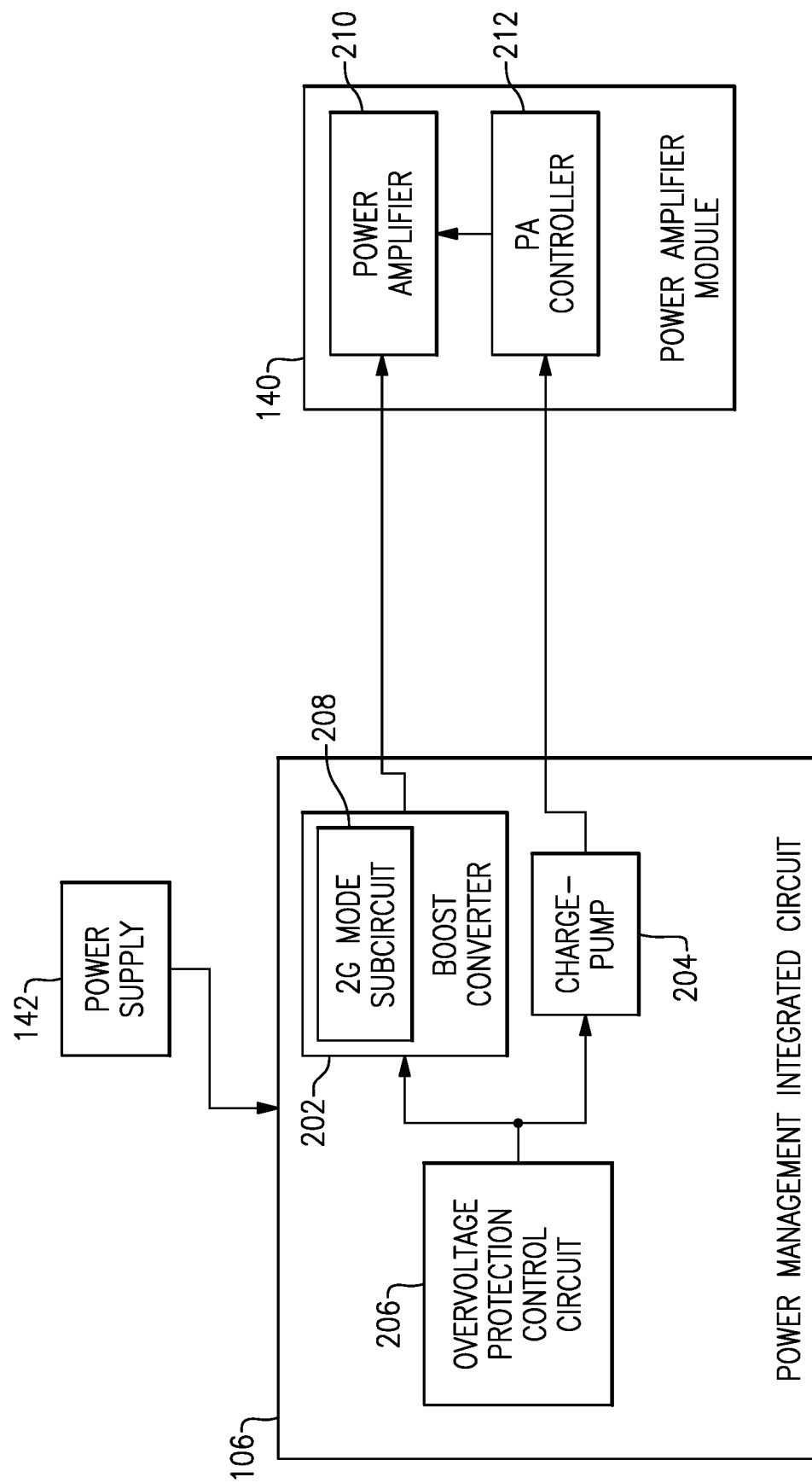
FIG. 2 illustrates a block diagram of an embodiment of a power management integrated circuit and power amplifier module of the wireless device of FIG. 1.

FIG. 2 illustrates a block diagram of an embodiment of a power management integrated circuit 106 and power amplifier module 140 of the wireless device 100 of FIG. 1. As illustrated in FIG. 2, the power management integrated circuit (PMIC) 106 may be in communication with the power supply 142, which may provide power, or a voltage signal, to the power management integrated circuit 106. The voltage supplied as Vin to the power management integrated circuit 106 may be equivalent to the battery or power supply voltage. Often, the supplied voltage is between 3.5 and 5 volts.

The power management integrated circuit 106 may include a number of circuits or circuit elements that modify the voltage received from the power supply 142. The voltage may be modified to satisfy a voltage requirement for one or more circuit elements that receive power from the power management integrated circuit 106. In some cases, the voltage may be modified based on the desired power output for wireless device. This power output may vary as the wireless device is positioned closer to or further from another device, such as a base station, in communication with the wireless device.

The power management integrated circuit 106 may include a boost converter 202 and a charge-pump 204. The boost converter 202 may act as a DC to DC regulator that is capable of adjusting the voltage supplied to the power management integrated circuit 106 by the power supply 142. The boost converter 202 may increase the received voltage to a higher voltage level. For example, the boost converter 202 may increase the Vin supplied by the power supply 142 from 3.5 volts to up to 10 or 11 volts. This boosted voltage may be supplied by the boost converter 202 to a power amplifier 210 of the power amplifier module 140.

The charge-pump 204 may also act as a DC to DC regulator or converter is capable of adjusting the voltage supplied to the power management integrated circuit 106 by the power supply 142. The charge-pump 204 may maintain the voltage output by the power management integrated circuit 106 at a lower level than the boost converter 202. For example, the charge-pump 204 may output a voltage of 4.5 V. Further, the voltage output by the charge-pump 204 may be limited to 6.5 V or less. In contrast, in certain embodiments, the voltage output by the boost converter 202 may be higher than 13 V without causing damage to the power amplifier 210.

The voltage output by the charge-pump 204 may be supplied to the power amplifier controller 212. The power amplifier controller 212 may include circuitry for controlling the operation of the power amplifier 210. For example, the power amplifier controller 212 may include one or more biased circuits for biasing the power amplifier 210. Further, the power amplifier controller 212 may include one or more circuits for modifying the gain factor for the power amplifier 210.

Often, the power amplifier 210 operates at a higher voltage than the power amplifier controller 212. Further, it is often the case the power amplifier 210 can receive a higher voltage without damaging the power amplifier 210 in the power amplifier controller 212 may receive before being damaged. Accordingly, although an overvoltage protection circuit may prevent the boost converter 202 from exceeding a particular voltage threshold, a surge event may cause the voltage supplied to the power amplifier controller 212 to exceed a safe voltage level causing damage to the power amplifier controller 212. In other words, during a surge event, a voltage output by the charge-pump 204 may exceed the voltage they can be processed by the power amplifier controller 212 causing the power amplifier 212 to be damaged. This surge event may occur when there is a rapid change in the voltage output by the power supply 142. This rapid change may be caused by plugging the wireless device 102 main power or a wall socket.

To prevent the power amplifier controller 212 from being damaged during a surge event, the power management integrated circuit 106 may include an overvoltage protection control circuit 206 that is capable of determining whether the voltage supplied by power supply 142 exceeds a reference voltage and/or a threshold voltage. If it is determined that the voltage supplied by the power supply 142 exceeds the reference voltage and/or the threshold voltage, the overvoltage protection's control circuit 206 may modify the configuration of the charge-pump 204 to prevent the charge-pump 204 from providing an excessive voltage to the power amplifier controller 212.

In certain embodiments, the boost converter 202 may also include a 2G mode subcircuit 208. The 2G mode subcircuit 208 enables the output of the boost converter 202 to be modified to support communicating over a 2G network. In some embodiments, to communicate over the 2G network may include providing a lower voltage to the power amplifier to 10 then when communicating over other networks. Accordingly, the 2G mode subcircuit 208 may be used to provide an output of the charge-pump 204 as an output of the boost converter 202 in place of the output of the boost converter 202 when operating in a non-2G mode.

Example PMIC Circuit

Figure 3:
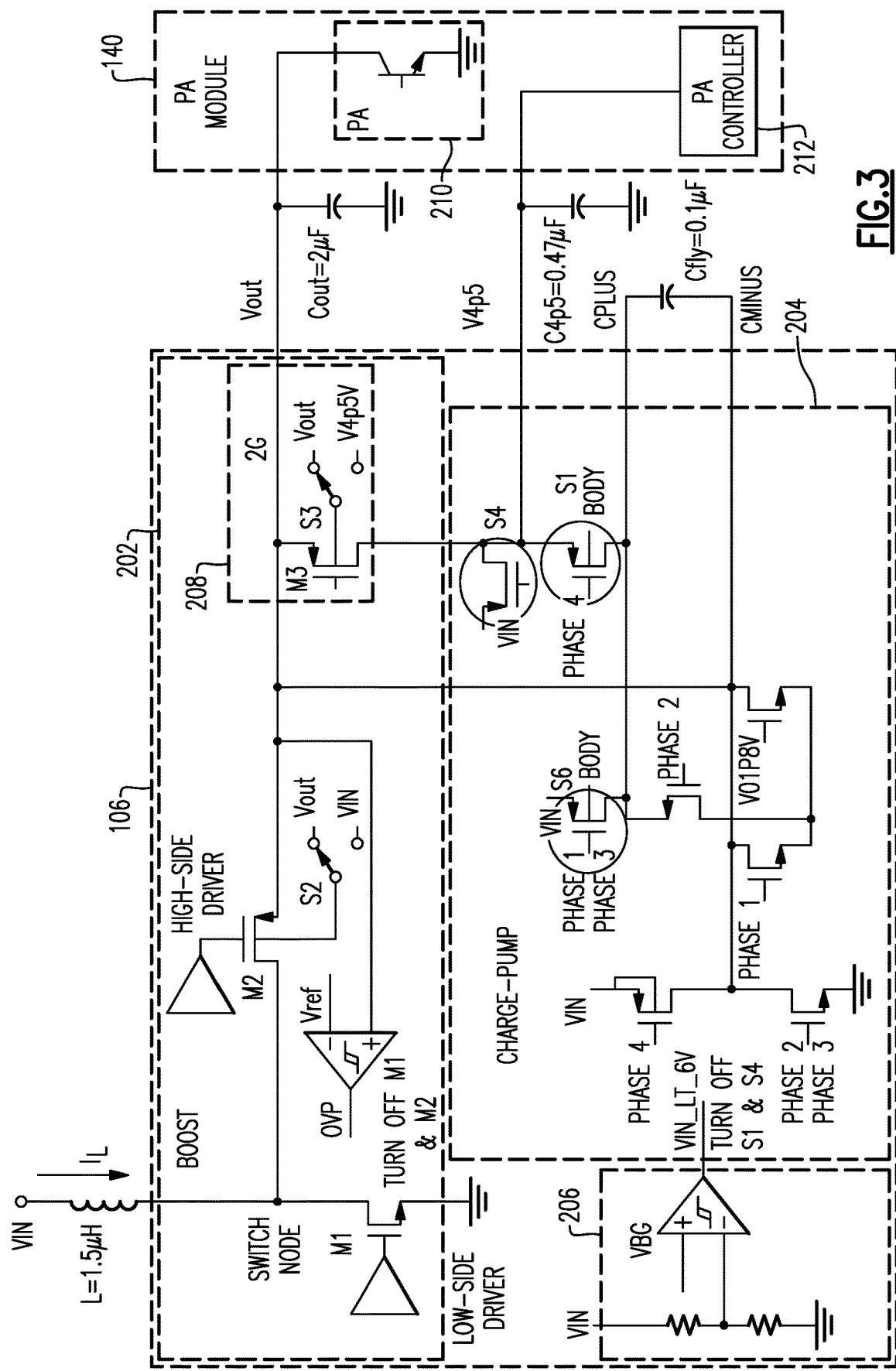
FIG. 3 illustrates a circuit diagram of an embodiment of the power management integrated circuit and power amplifier module of FIG. 2.

FIG. 3 illustrates a circuit diagram of an embodiment of the power management integrated circuit 106 and power amplifier module 140 of FIG. 2. The power management integrated circuit 106 receives a voltage VIN. This voltage may be received from the power supply 142 illustrated in FIG. 2.

The boost converter 202 may include one or more drivers. For example, the illustrated boost converter 202 may include a low-side driver and a high-side driver. The low-side driver may include an NMOS transistor M1 with a drain connected to a load, which is connected to VIN, and the source connected to ground. The gate of the NMOS transistor M1 may be driven by a positive voltage from the driver to activate or turn on the NMOS transistor. The high-side driver may include a PMOS transistor M2 with the drain connected to VIN and the source connected to the Vout of the boost converter 202 and the power management integrated circuit 106, which is fed to the power amplifier 210 of the power amplifier module 140. The gate of the PMOS transistor M2 may be pulled down to turn on or activate the PMOS switch M2. It should be understood that the depiction of the boost converter 202 in FIG. 3 is simplified for ease of illustration and that the boost converter 202 may include additional circuitry, such as resistors and additional transistors, and/or connections, such as control lines, to facilitate operation of the boost converter 202.

The boost converter 202 may be used to boost or otherwise modify the voltage Vin supplied to the power management integrated circuit 106. This boosted voltage may be higher than the voltage Vin. For example, the boost converter 202 can boost a Vin of 3.5 volts up to 11.7 volts, or higher. This boosted voltage may be output along a Vout pin or connection to the power amplifier 210 of the power amplifier module 140.

In certain embodiments, overvoltage protection may be implemented for the boost converter 202 by determining on a cycle by cycle basis whether the output voltage exceeds a boost converter threshold. The cycles may be determined based on a switching speed of one or more of the switches M1 and M2. Alternatively, or in addition, the cycles may be determined by a controller, such as the overvoltage protection controller, a controller in a transceiver or baseband circuit, or other controller that may monitor overvoltage occurrences or surge events.

The boost converter threshold may be set based on a voltage that can be supported by the power amplifier 210 without the power amplifier 210 be damaged or operating in an undesirable range. Typically the power amplifier 210 can support a voltage that is higher than a voltage that can be supported by the power amplifier controller 212 without being damaged. For instance, while the power amplifier controller 212 may support a voltage of 4, 5, or 6 volts, the power amplifier may support a voltage of 11, 12, 13 or more volts. Thus, for example, the boost converter threshold may be set at 11.7 volts. The boost converter threshold may be configured during manufacture. Alternatively, or in addition, the threshold may be determined by a controller, such as the overvoltage protection controller, a controller in a transceiver or baseband circuit, or other controller that may monitor overvoltage occurrences or surge events. It should be understood that the boost converter 202 may include additional circuitry that is not illustrated in FIG. 3. This additional circuitry may, among other operations, determine the cycle time and/or the boost converter threshold for determining whether to enter an overvoltage protection state that prevents the output of the boost converter from exceeding a threshold voltage (e.g., 11.7 volts or 12 volts, etc.).

If it is determined that the output voltage is higher than the boost converter threshold, one or more of the switches M1 and M2 are prevented from turning on. For example, when the output voltage of the boost converter 202 exceeds 11.7 volts, the switch M1 and/or M2 is prevented from being activated or turned on preventing the voltage supplied to the power amplifier 210 by the boost converter 202 from exceeding a safe and/or desired operating range for the power amplifier 210. Once the voltage drops below the threshold (e.g., 11.7 volts) the switches are allowed to activate. Alternatively, in some embodiments, after the voltage exceeds the threshold (e.g., 11.7 volts), the voltage is required to drop below a second threshold (e.g., 11.3 volts). The use of the second threshold that is below the first boost converter threshold may be used to prevent the boost converter 202 from bouncing between two states.

It should be understood that the power amplifier 210 can operate at lower voltages, such as 4 or 5 volts. However, as previously described, there are instances when the power amplifier 210 operates at a higher voltage, which is often higher than the power amplifier controller 212 may operate or may operate without being damaged. For example, the power amplifier controller 212 may be limited to operating at 4, 5, or 6 volts before the increased voltage causes undesirable operation or damage to one or more circuit elements of the power amplifier controller 212. However, a voltage of 6 or 7 volts may not trigger the overvoltage protection included in some power management integrated circuits because the voltage is below the voltage desired or supported by the power amplifier 210.

In certain embodiments, the power management integrated circuit 106 may include a charge-pump 204 that provides a voltage from a separate output to the power amplifier controller 212. This output may be lower, such as 4.5 volts, and can be output on the V4p5 pin, or connection, instead of the Vout pin. The output of the V4p5 pin may typically supply a voltage of up to 4.5 volts to the power amplifier controller 212. However, during a surge event, this output may exceed 4.5 volts and may result in damage or undesired operation of the power amplifier controller 212, particularly if the increase in voltage exceeds 6 or 7 volts. In some cases, the elements of the power amplifier controller 212 are designed to operate at 6 volts or less. Thus, a voltage on the V4p5 pin of 7 volts can damage the power amplifier controller 212.

The output at the V4p5 pin may be based on the input Vin. Thus, if the input Vin received from the power supply 142 exceeds 7 volts, the output supplied to the power amplifier controller 212 may exceed 7 volts. Typically, the power amplifier 210 can process the 7 volt output and the boost converter 208 may be configured to supply voltages of up to 11.7 volts or more during normal, or non-surge, operation. Thus, existing overvoltage protection systems may not be triggered by a 7 volt power surge.

To prevent the output of the V4p5 pin from exceeding 7 volts, an overvoltage protection control circuit 206, which may be separate from or may be included as part of the overvoltage protection circuit of the boost converter 202, can be included in the power management integrated circuit 106. The overvoltage protection control circuit 206 may be configured to prevent the charge-pump 204 from outputting a voltage on the V4p5 pin that exceeds a charge-pump threshold. This charge-pump threshold may be set at a lower value than the boost converter threshold. For example, while the boost converter threshold may be set at 11.7 volts or higher, the charge-pump threshold may be set at 6 or 6.2 volts. Further, as with the boost converter, the charge-pump may include a second threshold that is lower than the first threshold and is used to prevent switches of the charge-pump from bouncing if the input current oscillates around the threshold that triggers the overvoltage protection operation. For example, while the first charge-pump threshold that triggers the overvoltage protection operation or process may be 6.2 volts, the second charge-pump threshold that deactivate the overvoltage protection may be set at 5.4 volts.

The overvoltage protection circuit 206 as illustrated in FIG. 3 may include a comparator that compares the voltage Vin with a reference voltage. If it is determined that the voltage Vin exceeds the reference voltage, the overvoltage protection circuit 206 may be configured to deactivate the charge-pump by deactivating or switching off one or more of the transistors S1, S4, or S6. Each of the transistors S1, S4, and S6 may be PMOS transistors or PMOS switches. Deactivating or disconnecting the transistor S1 or S6 can include or result in disabling of the phase for the charge-pump. Disabling the phase for the charge-pump may result in the charge-pump itself, or the functionality of the charge-pump being disabled. Further, deactivating or disconnecting the transistor S4 can include or result in disconnecting the switch from the V4p5 pin preventing the Vin from being output or affecting the output voltage supplied to the PA controller 212. Moreover, deactivating or disconnecting the transistor S6 can include or result in disconnecting the switch from the CPLUS connection to the capacitor between the CPLUS and CMINUS pins. The capacitor between the CPLUS and CMINUS connection nodes may be referred to as a flying capacitor. In certain embodiments, this flying capacitor is not connected to ground. The flying capacitor may store charge that enables the output of the charge-pump to be pumped or boosted higher when a higher voltage is desired based, for example, on an operating mode of the power amplifier 210 or power amplifier controller 212. For example, if a bias circuit, which may be included as part of the PA controller 212 for biasing the power amplifier 210, requires a higher voltage, the charge stored in the flying capacitor may be used to boost the output of the charge-pump 204. During a surge event, the transistor S1 or S6 can be disconnected or disabled to remove the flying capacitor from the output pin of the charge-pump.

After reconfiguring the charge-pump 204 to prevent a voltage spike or surge from providing an increased voltage to the power amplifier controller 212, the overvoltage protection circuit 206 may maintain the reconfigured charge-pump 204 in its reconfigured configuration until the overvoltage protection circuit 206 determines that the voltage Vin has dropped below the reference voltage. In some embodiments, to prevent the possibility of excessive bouncing between an overvoltage configuration and a non-overvoltage configuration, a second reference voltage is used to determine whether to restore the configuration of the charge-pump 204 to its operating state prior to the detection of the surge event. This second reference voltage may be lower than the reference voltage used to detect the surge event. For example, the second reference voltage may be 300, 400 mV, or some other voltage below the reference voltage used to detect the surge event. For instance, the initial reference voltage used to detect the surge event may be set at 6.2 V and the second reference voltage may be set at 5.4 V. Accordingly, in this non-limiting example, if Vin exceeds 6.2 volts, the overvoltage protection circuit 206 may reconfigure the charge-pump to prevent the surged voltage from being provided to the power amplifier controller 212. Once the Vin drops below 5.4 volts after the occurrence of a surge event, the overvoltage protection circuit 206 may restore the configuration of the charge-pump 204 or further reconfigure the charge-pump 204 to enable the charge-pump 204 to provide a voltage based on the Vin to the power amplifier controller 212. Reconfiguring the charge-pump 204 to supply a voltage based on Vin to the power amplifier controller 212 after a surge event may include activating or switching on one or more of the transistors S1, S4, or S6 that may previously have been deactivated when a surge event was detected.

Some wireless devices operate in or support communication over a 2G network. In some such embodiments, the power amplifier 210 may operate within a different voltage range when supporting 2G operation. To support 2G operation, the boost converter 202 may include a 2G mode subcircuit 208 to facilitate operating in 2G mode. A controller, the baseband subsystem 108, or other configuration system may configure the power management integrated circuit 106 to operate in 2G mode. In some embodiments, an external system, such as a base station, may cause the wireless device, and consequently the power management integrated circuit 106, to operate in 2G mode.

When operating in 2G mode, the power amplifier 210 may be configured to operate using a lower voltage than when the power amplifier 210 is configured to operate in a non-2G mode. For example, when operating in non-2G mode (e.g., 3G or 4G LTE) the power amplifier may operate with or receive a voltage of up to 11.7 volts or more. It should be understood that while the power amplifier 210 may operate with a voltage of 11.7 volts or more without being damaged or operating in an undesirable manner, the power amplifier 210 may also operate with lower voltages, such as a voltage of 4, 5, or 6 volts. When operating in 2G mode, it is often desirable for the power amplifier 210 to operate at a lower voltage range. For example, the power amplifier 210 may operate with a received voltage of 4 or 5 volts.

When operating in 2G mode, the boost converter 202 may be configured, using the 2G mode subcircuit 208, to output a voltage generated or supplied by the charge-pump 204 instead of a voltage that is generated or supplied by the boost converter 202 when operating in non-2G mode. During non-2G mode, such as when the wireless device is communicating using a 3G or 4G LTE network, the boost converter 202 may be configured to output a voltage at the Vout pin that the boost converter 202 generates or modifies based on the power supply 142 voltage provided as Vin. During 2G mode, the 2G mode subcircuit 208 may be configured to switch the voltage that is output by the Vout pin to the power amplifier 210 from the voltage that the boost converter outputs in non-2G mode to the voltage that the charge-pump supplies to the power amplifier controller 212. Accordingly, in certain embodiments, the voltage supplied along the Vout pin and the V4p5 pin may be the same.

The 2G mode subcircuit 208 may include a transistor M3 and/or switch S3 that can be configured to switch the output of the Vout pin from the voltage generated by the boost converter 202 to the output generated by the charge-pump 204 and vice versa. The 2G mode subcircuit 208 may be controlled by the baseband subsystem 108 or any other controller that can regulate operation of the communication mode of the wireless device 100. Although illustrated as part of the boost converter 202, in some embodiments, the 2G mode subcircuit 208 may be a separate circuit or part of a separate die that operates as an intermediary between the boost converter 202 and the power amplifier module 140 enabling the 2G mode subcircuit 208 to control the voltage that is supplied to the power amplifier 210.

In certain embodiments, the overvoltage protection circuit 206 may be configured to control operation of the 2G mode subcircuit 208 during a surge event. As with non-2G mode, a comparator of the overvoltage protection circuit 206 may determine whether the voltage Vin exceeds a reference voltage. The reference voltage compared to the voltage Vin when operating in 2G mode may differ from the reference voltage used when operating in a non-2G mode. In some embodiments, the reference voltage may differ between 2G mode and non-2G mode because, for example, the power amplifier 210 may support or operate at a higher, or different, voltage than the power amplifier controller 212, even when operating in 2G mode. In some embodiments, a separate comparator circuit may be used to determine the occurrence of a surge event when operating in 2G mode versus when operating in non-2G mode. Further, in some embodiments, a separate comparator may be used to detect a surge event for the power amplifier 210 and the power amplifier controller 212. By using a separate comparator, it is possible to have a different threshold voltage for the power amplifier 210 and the power amplifier controller 212 when operating in 2G mode. In some embodiments, the same comparator may be used, but a different reference voltage may be supplied when operating in 2G mode versus non-2G mode.

When operating in 2G mode, if the overvoltage protection circuit 206 determines that the voltage Vin exceeds the 2G mode reference voltage, the overvoltage protection circuit 206 may be configured to remove the connection between the charge-pump 204 and the output pin, Vout, of the boost converter 202. Subsequently, if the overvoltage protection circuit 206 determines that the voltage Vin no longer exceeds the 2G mode reference voltage, the overvoltage protection circuit 206 may be configured to restore the connection between the charge-pump 204 and the output pin, Vout, of the boost converter 202. As with the operation previously described with respect to the non-2G mode operation, in some embodiments, the 2G mode reference voltage may differ for determining whether a surge event is occurring and for determining whether to restore a configuration of the power management integrated circuit 106 after the occurrence of a surge event. For example, if it is determined that the Vin, or in some cases the Vout exceeds 6.6 volts, then the overvoltage protection circuit 206 may determine that a surge event is occurring and may disconnect the PMOS switch M3 from the V4p5 pin thereby removing the connection between the charge-pump 204 and the boost converter 202 output Vout. If it is subsequently determined that the Vin, or in some cases the Vout, is less than 4.3 volts, then the overvoltage protection circuit 206 may determine that a surge event has ended and may reconnect the PMOS switch M3 to the V4p5 pin thereby restoring the connection between the charge-pump 204 and the boost converter 202 output Vout. Moreover, as previously described above, one or more of the transistors of the charge-pump may be deactivated or disconnected to prevent a voltage exceeding an overvoltage protection threshold from being provided to the power amplifier controller 212. Preventing the voltage exceeding the overvoltage protection threshold from being provided to the power amplifier controller 212 may occur in both 2G mode and non-2G mode.

The power amplifier module 140 may include one or more power amplifiers 210 and one or more power amplifier controllers 212. Although the power amplifier 210 is illustrated as a single stage power amplifier, the present disclosure is not limited as such. The power amplifier 210 may be a multi-stage power amplifier with two, three, or more stages. Further, the output of the boost converter 202 may be provided to a plurality of power amplifiers included by the power amplifier module 140. In some embodiments, the power management integrated circuit 106 may include multiple boost converters 202 that are each separately capable of providing different output voltages to different power amplifiers of the power amplifier module 140.

The power amplifier controller 212 may include any circuitry that can control operation of the power amplifier 210. In some embodiments, the power amplifier controller 212 may include, or may control, one or more bias circuits (not shown) for biasing the power amplifier 210 with a bias current or voltage. The power amplifier controller 212 may set the operating point for the power amplifier 210 by configuring a bias circuit of the power amplifier 210. In some embodiments, the power amplifier controller 212 may control multiple power amplifiers. In other embodiments, the power amplifier module 140 may include multiple power amplifier controllers that each control different power amplifiers of the power amplifier module 140.

Example Overvoltage Protection Control Circuit

Figure 4:
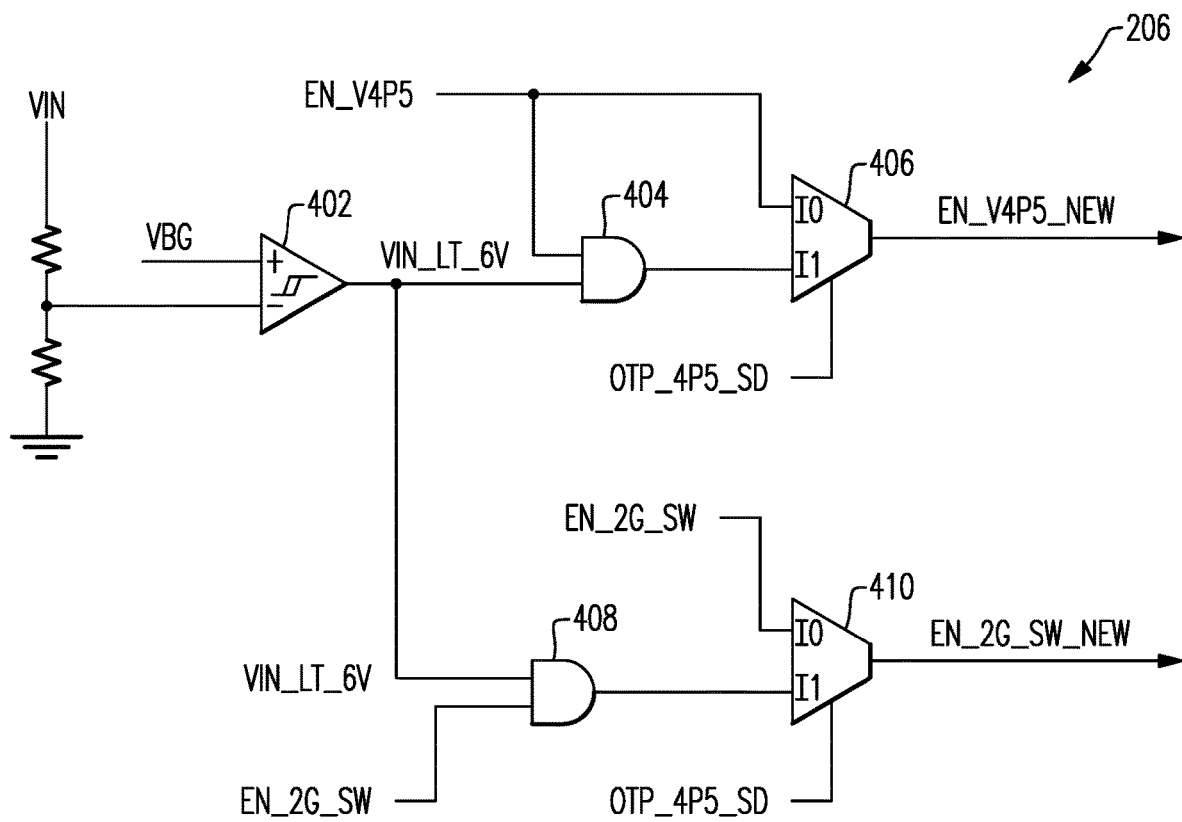
FIG. 4 illustrates a circuit diagram of an embodiment of an overvoltage protection control circuit.

FIG. 4 illustrates a circuit diagram of an embodiment of an overvoltage protection control circuit 206. As previously described, the overvoltage protection control circuit 206 may include a comparator 402. The comparator 402 may compare the power supply voltage Vin provided to the power management integrated circuit 106 with a reference voltage VBG. The VBG voltage or bandgap voltage may be a temperature independent voltage that can be set by a controller as a reference for determining whether a surge event is occurring that may cause an unsupported voltage to occur that can damage one or more of the components of the power amplifier controller 212 or power amplifier module 140. The VBG voltage can be set at a desired reference voltage by a controller. For example, the VBG voltage may be 6.2 volts, or 6 volts. The comparator may output a value corresponding to the result of the comparison, which can be used to enable or disable the output of the charge-pump 204. In some embodiments, the VBG may be set to a different value after the charge-pump 204 output is disabled to prevent bouncing, or rapid alternation, of the charge-pump 204 configuration. For example, the VBG may be set to 5.4 volts after a surge event has been detected.

The overvoltage protection control circuit 206 may further include digital logic 404 that enables the output of the charge-pump 204, or the V4p5 pin to be enabled or disabled independently of a detection of the surge event. Further, the overvoltage protection control circuit 206 may include additional logic or circuitry 406 enabling the overvoltage protection functionality to be disabled. The disabling of the overvoltage protection functionality may be performed by a manufacturer. In some cases, the additional logic 406 may be omitted.

In certain embodiments, the overvoltage protection control circuit 206 may include a feedback loop that can automatically adjust the VBG reference voltage based on the state of the overvoltage protection control circuit 206. For example, if VBG is set to 6.2 volts and a surge event is not detected, the output of the digital logic 404 may be fed back to a controller as part of a feedback loop to maintain the value of the VBG reference voltage at 6.2 volts. Once a surge event is detected causing the output of the controller 402 and/or the digital logic 404 to change, the output of the digital logic 404 may be fed back to the controller as part of the feedback loop to cause the VBG reference voltage to be modified to, for example, 5.4 volts. Similarly, after the Vin voltage drops below the modified VBG reference voltage causing the output of the controller 402 and/or the digital logic 404 to be restored to its original value, the output of the digital logic 404 may be fed back to the controller as part of the feedback loop to cause the VBG reference voltage to be restored to its original value of 6.2 volts in this particular example.

The overvoltage protection control circuit 206 may include additional logic 408 and 410 for controlling and/or enabling the output of the boost converter 202 when the power amplifier is being operated in 2G mode. The digital logic 408 can cause the boost converter 202 to provide the output of the V4p5 pin of the charge-pump 204 to the output of the boost converter 202 using the 2G mode subcircuit when the Vin is below the VBG reference voltage. When Vin is above the VBG reference voltage, the output of the charge-pump can be disconnected from the boost converter 202. Similar to the description above for configuring the charge-pump 204 when in a non-2G mode, the overvoltage protection control circuit 206 may include a feedback loop for configuring the VBG with different voltages based on the state of the overvoltage protection control circuit 206 and whether a surge event was detected. In addition, the overvoltage protection control circuit 206 may include additional logic or circuitry 410 enabling the overvoltage protection functionality to be disabled when operating in 2G mode. The disabling of the overvoltage protection functionality may be performed by a manufacturer. In some cases, the additional logic 410 may be omitted.

Example Surge Protection Process

Figure 5:
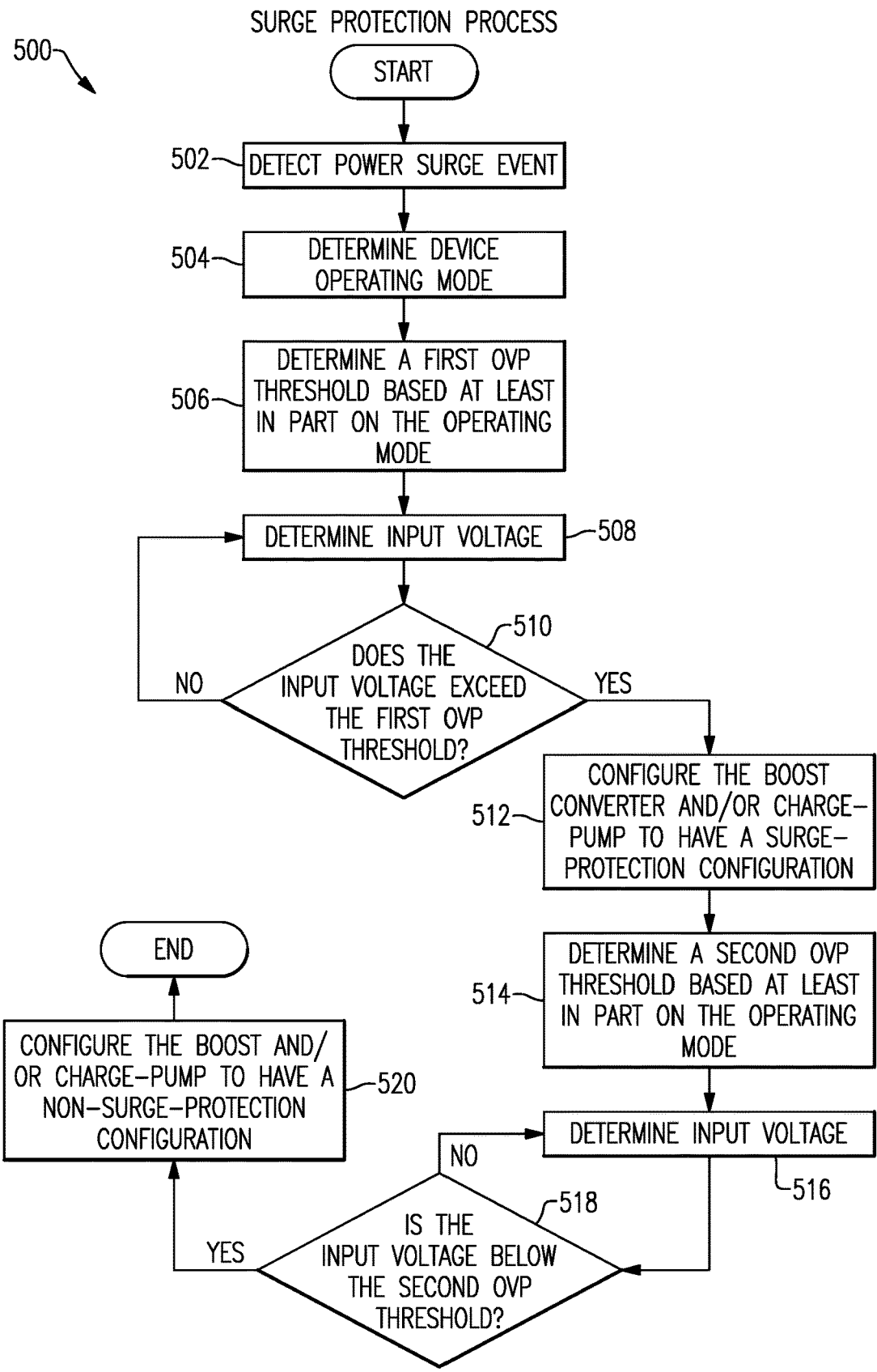
FIG. 5 presents a flowchart of an embodiment of a surge protection process.

FIG. 5 presents a flowchart of an embodiment of a surge protection process 500. It should be understood that the process 500 is one example of a surge protection process. Other processes for performing surge protection are possible. For example, operations of the process 500 may be performed in a different order or substantially in parallel. Thus, the order of the operations described with respect to the process 500 is for ease of description and not to limit the process 500. Moreover, it should be understood that a variety of systems, including a variety of hardware, software, firmware, or a combination thereof can implement at least portions of the process 500. For example, the process 500 may be performed, at least in part, by the power management integrated circuit 106, overvoltage protection control circuit 206, the baseband subsystem 108, a call processor (not shown), the power supply 142, or the transceiver 110, or combinations of the same, and so forth. To simplify discussion and not to limit the present disclosure, the process 500 will be described with respect to particular systems.

The process 500 may begin when, for example, the overvoltage protection control circuit 206 detects a power surge event at block 502. The power surge event may include any event that causes a voltage supplied to the power management integrated circuit 106 to exceed a threshold voltage. For example, a power surge event may occur due to a change in charging state of the wireless device 100. As another example, a power surge event may occur when the wireless device 100 is plugged into or removed from a wall socket or mains electricity connection. As yet additional examples, a power surge event may occur due to a lightning strike, damage to a power supply or power source, or damage to equipment of a power station or electricity transportation equipment (e.g., a blown transformer or cut power line). Regardless of the source of the power surge event, in most cases the power surge event causes an unexpected, and often, quick and large change in the voltage supplied to components of the wireless device 100. In some embodiments, the power surge event is detected based on a change of a voltage supplied by the power supply 142 to the power management integrated circuit 106.

In certain embodiments, the block 502 is optional or omitted. For example, the detection or determination of a possible power surge event may be included in or inherent in the determination at the decision block 510 of whether the input voltage exceeds an overvoltage protection threshold as described below. Further, the process 500 may be used to detect an unexpected or unsupported change in voltage supplied to components of the wireless device 100, such as the power amplifier controller 212, regardless of whether a power surge event occurs.

At block 504, the overvoltage protection control circuit 206 determines an operating mode of the wireless device 100. The operating mode of the wireless device 100 may include or correspond to any type of communication network or standard supported by the wireless device 100. For example, the wireless device may be configured to operate in a 2G, 3G, 4G, 4G LTE, or HPUE mode. The determination of the operating mode may be made based at least in part on a signal received from a base station, a router, or other device that is in communication with the wireless device 100. In some embodiments, the overvoltage protection control circuit 206 may determine an operating mode of the wireless device 100 based at least in part on a signal or command from the baseband subsystem 108, transceiver 110, or other processor or control system of the wireless device 100.

At block 506, the overvoltage protection control circuit 206 determines a first overvoltage protection (OVP) threshold based at least in part on the operating mode determined at the block 504. In certain embodiments, the first overvoltage protection threshold may be device specific. For example, if the power amplifier controller 212 includes components that operate at 4.5 volts and that may be damaged when a voltage provided to the power amplifier controller 212 exceeds 6.5 or 7 volts, the first overvoltage protection threshold may be set at some value between 4.5 volts and 6.5 volts, such as at 6 or 6.2 volts. As a second example, if the power amplifier controller 212 includes components that operate at 3 volts and that may be damaged when a voltage provided to the power amplifier controller 212 exceeds 6 volts, the first overvoltage protection threshold may be set at some value between 3 volts and 6 volts, such as at 5, 5.5, or 6 volts.

In certain embodiments, the first overvoltage protection threshold may vary based on an operating mode of the wireless device 100. For example, a 2G and a non-2G operating mode may be associated with different overvoltage protection thresholds. In some embodiments, the over voltage protection control circuit 206 may access a table or other data structure to determine a voltage value for the first overvoltage protection threshold based on the determined operating mode of the wireless device 100. In other embodiments, the first overvoltage protection threshold may be configured or set based on the circuit configuration of the power management integrated circuit 106, or other component of the wireless device 100, used to operate in a particular operating mode of the wireless device 100.

At block 508, the overvoltage protection control circuit 206 determines an input voltage, Vin, provided to the power management integrated circuit 106. The input voltage may be supplied by the power supply 142, which may include a battery, a voltage supplied by a battery, and/or a voltage supplied by an electrical connection to a wall socket or to mains.

At decision block 510, the overvoltage protection control circuit 206 determines whether the input voltage exceeds, or in some cases satisfies or matches, the first overvoltage protection threshold. In certain embodiments, the first overvoltage protection threshold may be provided as a reference voltage to a comparator, which then compares the first overvoltage protection threshold to the input voltage received or determined at the block 508. The result of the comparison may determine whether the input voltage satisfies or exceeds the first overvoltage protection threshold. The reference voltage may be a temperature independent voltage, such as a bandgap voltage VBG.

If it is determined at the decision block 510 that the input voltage does not exceed or satisfy the first overvoltage protection threshold, the process 500 returns to the block 508 where the overvoltage protection control circuit 206 continues to determine or monitor the input voltage. The monitoring of the input voltage may occur continuously or intermittently at particular time or operational intervals. In some embodiments, the block 508 may include determining or confirming the operating mode of the wireless device 100 as previously determined at the block 504. In certain embodiments, if the operating mode of the wireless device 100 is determined to have changed, the overvoltage protection control circuit 206 may modify the first overvoltage protection threshold.

If it is determined at the decision block 510 that the input voltage satisfies or exceeds the first overvoltage protection threshold, the process 500 proceeds to block 512 where the overvoltage protection control circuit 206 configures the boost converter 202 and/or the charge-pump 204 to be in a surge-protection configuration. In certain embodiments, configuring the boost converter 202 and/or the charge-pump 204 to be in a surge-protection configuration may be based on an operating mode of the wireless device 100. When operating in 3G/4G/HPUE or certain other non-2G operating modes, the charge-pump 204 may be configured in a surge-protection configuration by disabling, deactivating, or disconnecting one or more of a phase of the charge-pump 204, a connection of an output pin (e.g., the V4p5 pin) from the input voltage, and/or a connection of the output pin to the CPLUS node, which may result in the flying capacitor, or the charge stored thereon, being removed from the output to the charge-pump 204. When operating in a 2G mode, the boost converter 202 and/or the charge-pump 204 may be configured in a surge-protection configuration by disconnecting a switch between an output pin of the charge-pump (e.g., the V4p5 pin) and an output pin of the boost converter 202 (e.g., the Vout pin).

At block 514, the overvoltage protection control circuit 206 determines a second overvoltage protection threshold based at least in part on the operating mode of the wireless device 100. In some embodiments, the second overvoltage protection threshold may be equal to the first overvoltage protection threshold. In some such embodiments, the block 514 may be optional or omitted. In other such embodiments, the block 514 may still be performed because, for example, whether the first and second overvoltage protection threshold are the same may depend on an operating mode of the wireless device 100 and/or a manufacturer configuration of the wireless device 100. The first and second overvoltage protection thresholds may differ to prevent a form of switch bouncing that may cause the configuration of the boost converter 202 and/or the charge-pump 204 to be rapidly changed due to the input voltage hovering around the threshold voltage with numerous occurrences of the input voltage switching from above or below the threshold voltage in a relatively short period of time. In some cases, switch bouncing can damage a device or cause improper operation of a device due, for example, to insufficient time for components to settle in a particular configuration. By setting a second overvoltage protection threshold at some voltage that is lower than the first overvoltage protection threshold, switch bouncing can be reduced or eliminated. Thus, while the first overvoltage protection threshold may be set at 6.2 or 6.6 volts to determine whether to configure the boost converter 202 or the charge-pump 204 in a surge-protection configuration, the second overvoltage protection threshold may be set at 5.4 or 4.3 volts for determining whether to configure the boost converter 202 or the charge-pump 204 in a non-surge-protection configuration after the boost converter 202 or the charge-pump 204 have been configured in a surge-protection configuration.

In certain embodiments, the block 514 may include performing one or more of the embodiments associated with the block 506. In certain embodiments, the block 514 may include performing one or more of the embodiments described with respect to the block 504. For example, the block 514 may include performing operations associated with the block 504 to confirm that the operating mode of the wireless device continues to be the operating mode determined at a prior occurrence of the block 504 when, for example, the input voltage has not yet been determined to exceed the first overvoltage protection threshold.

At block 516, the overvoltage protection control circuit 206 determines the input voltage provided to the power management integrated circuit 106. Typically the operations associated with the block 516 are occurring at some point in time later than the operations associated with the block 508 and thus, the input voltage determined at the block 516 may differ from the input voltage determined at the block 508. In certain embodiments, the block 516 may include one or more of the embodiments described with respect to the block 508.

At decision block 518, the overvoltage protection control circuit 206 determines whether the input voltage is below, or in some cases satisfies or matches, the second overvoltage protection threshold. The input voltage used at the decision block 518 may be the voltage determined at the block 516, which may differ or have changed from the input voltage measured at an earlier time at the block 508. In certain embodiments, the decision block 518 may include one or more of the embodiments previously described with respect to the decision block 510.

If it is determined at the decision block 518 that the input voltage is not below or does not satisfy the second overvoltage protection threshold, the process 500 returns to the block 516 where the overvoltage protection control circuit 206 continues to determine or monitor the input voltage. As with the block 508, the monitoring of the input voltage at the block 516 may occur continuously or intermittently at particular time or operational intervals. In some embodiments, the block 516 may include determining or confirming the operating mode of the wireless device 100 as previously determined at the block 504. In certain embodiments, if the operating mode of the wireless device 100 is determined to have changed, the overvoltage protection control circuit 206 may modify the second overvoltage protection threshold.

If it is determined at the decision block 518 that the input voltage satisfies or is below the second overvoltage protection threshold, the process 500 proceeds to block 520 where the overvoltage protection control circuit 206 configures the boost converter 202 and/or the charge-pump 204 to be in a non-surge-protection configuration, or normal operating mode. Configuring the boost converter 202 and/or the charge-pump 204 to be in a non-surge-protection configuration may include restoring the boost converter 202 and/or the charge-pump 204 to the configuration they were in prior to the determination that the input voltage exceeded the first overvoltage protection threshold. In some embodiments, the restored configuration may differ because, for example, a current operating mode of the wireless device 100 may have changed. Restoring the charge-pump 204 to a non-surge-protection mode when the wireless device 100 is operating in 3G/4G/HPUE or certain other non-2G operating modes, may include enabling, activating, or connecting one or more of a phase of the charge-pump 204, a connection of an output pin (e.g., the V4p5 pin) to the input voltage, and/or a connection of the output pin to the CPLUS node. Restoring the boost converter 202 or the charge-pump 204 to a non-surge-protection mode when the wireless device 100 is operating in a 2G mode may include connecting a switch between an output pin of the charge-pump (e.g., the V4p5 pin) and an output pin of the boost converter 202 (e.g., the Vout pin).

Example Surge Protection Test Results

A number of tests and simulations were performed on prototype products that illustrate the efficacy of the embodiments disclosed herein in real-world products. The results of these tests can be compared to systems that do not include the overvoltage protection control circuit 206 for preventing an overvoltage from being supplied to a power amplifier controller 212 or to a power amplifier 210 during a 2G operation mode.

Figure 6A:
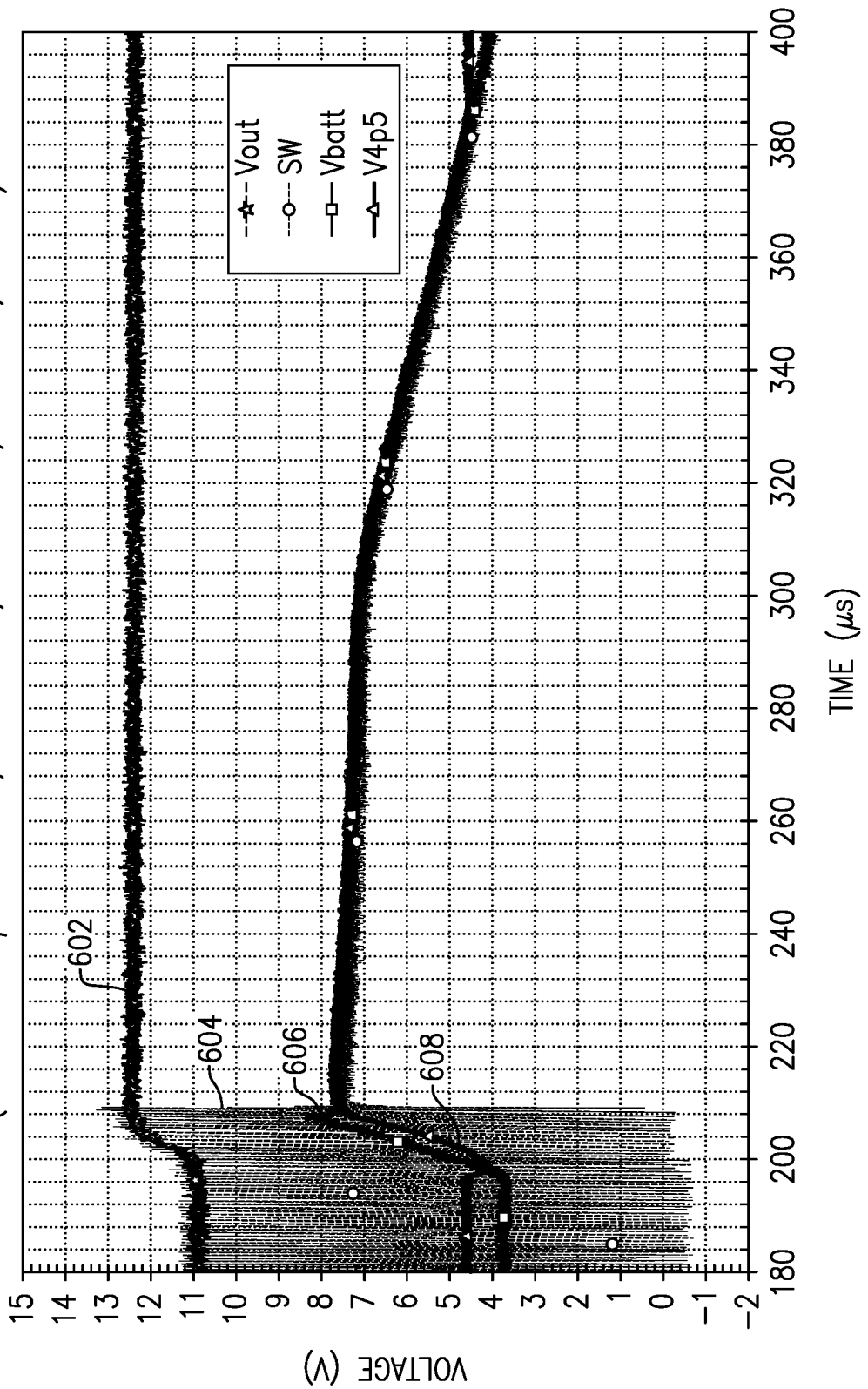
FIG. 6A depicts a graph illustrating a result of a power surge on the output of the charge-pump without overvoltage protection and with no load present.

FIG. 6A depicts a graph illustrating a result of a power surge on the output of the charge-pump without overvoltage protection and with no load present. The graph includes four lines 602, 604, 606, and 608. The line 602 illustrates the output, Vout, of the boost converter of the power management integrated circuit. The line 604 illustrates the switching of the boost converter between a boost mode and a non-boost mode. The switching line 604 represents the effect of turning the NMOS and/or PMOS transistors of the boost converter on or off. When the PMOS transistor is off, the line 604 drops to 0 volts, and when it is on the amplitude will rise to the Vout voltage of the boost converter. The line 606 illustrates the battery voltage Vbat, which corresponds to the input voltage Vin supplied to the power management integrated circuit 106 from a power supply 142. The line 608 illustrates the output of the charge-pump 206, V4p5. The sharp rise in the line 606 represents a power surge when the wireless device is plugged into a wall. As illustrated, the power surge can cause the Vbat to increase from roughly 3.8 volts to more than 8 volts in about 10 microseconds, or less. As Vbat rises to 8 volts, the switching of the boost will cease and the Vout 602 supplied to the power amplifier will rise to about 12.3 or 12.5 volts. Similarly, the V4p5 output 608 supplied to the power amplifier controller will rise from roughly 3.8 volts to 7.8 volts, or more. Because the power amplifier is configured to handle voltages as high as 13 volts if not more without damage, the power surge is not harmful to the power amplifier. However, the increase of the voltage supplied to the power amplifier controller can cause damage because, in some implementations, the power amplifier controller includes components that are configured to normally operate at 4.5 volts and can be damaged when the voltage exceeds 6 volts.

FIG. 6B depicts a graph illustrating a result of a power surge on the output of the charge-pump with overvoltage protection and with no load present. The graph illustrated in FIG. 6B is similar to that in FIG. 6A and the lines that have not been changed have the same reference numerals. However, as illustrated by the line 620, the inclusion of the overvoltage protection control circuit 206 as disclosed herein prevents the V4p5 output from exceeding a set threshold, which in the illustrated example is about 6.1 or 6.2 volts.

Figure 7A:
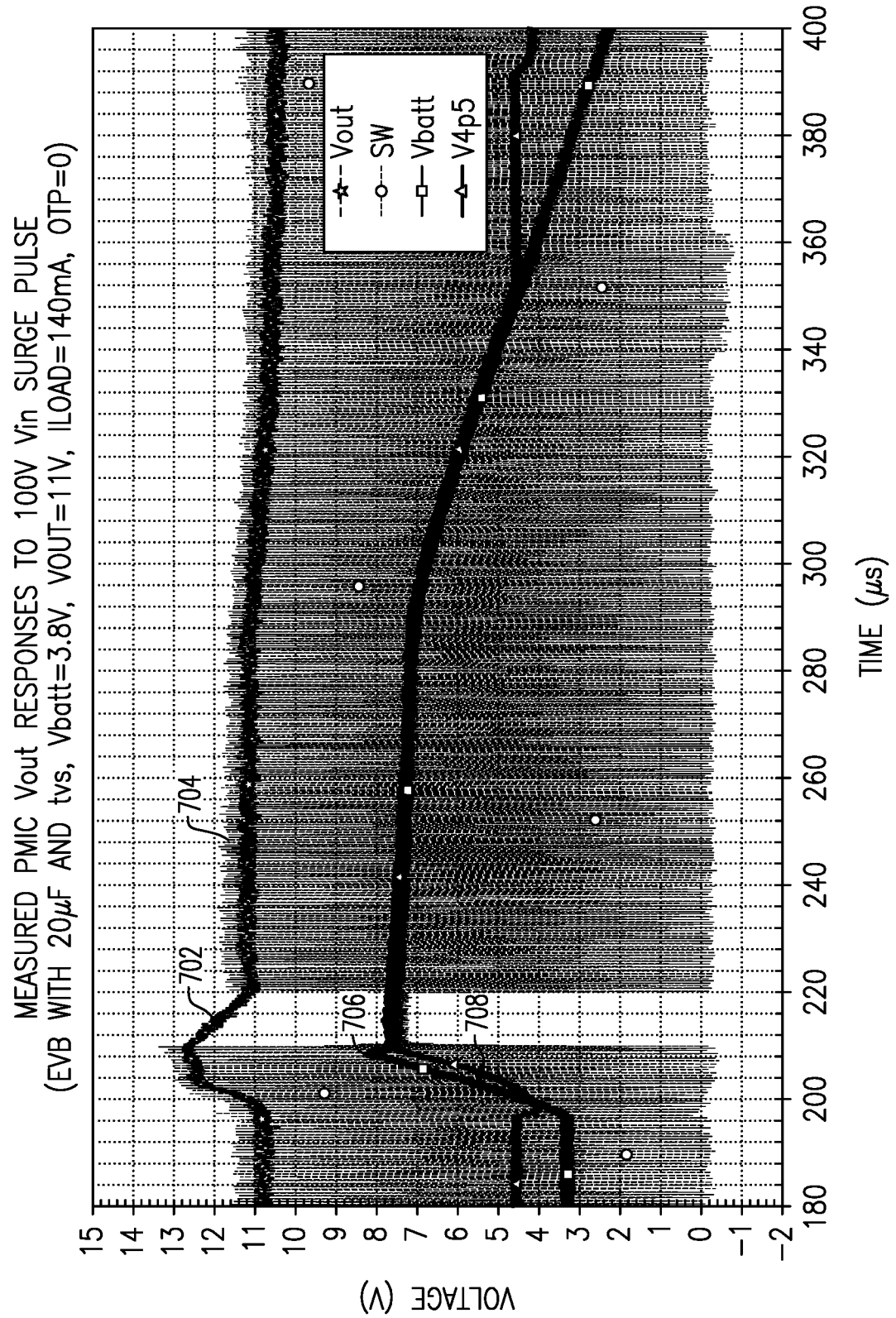
FIG. 7A depicts a graph illustrating a result of a power surge on the output of the charge-pump without overvoltage protection and with a current load present.
Figure 7B:
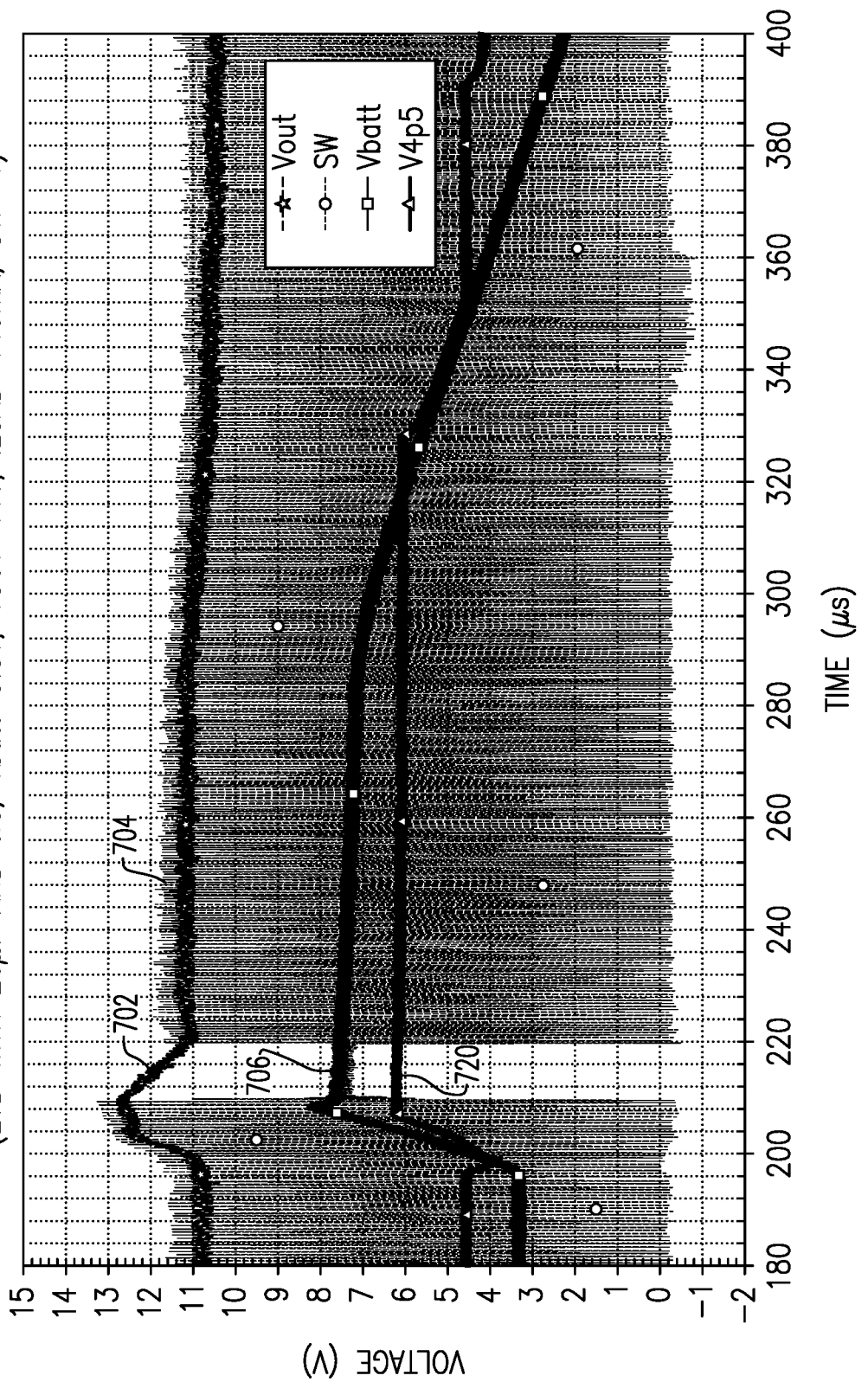
FIG. 7B depicts a graph illustrating a result of a power surge on the output of the charge-pump with overvoltage protection and with a current load present.

FIGS. 7A and 7B are similar to FIGS. 6A and 6B respectively, but with a load supplied at the output of the power management integrated circuit. FIG. 7A depicts a graph illustrating a result of a power surge on the output of the charge-pump without overvoltage protection and with a current load present. Line 702 represents the Vout of the boost converter. As the power supply voltage Vin, represented by line 706 surges, the output Vout increases causing the switching of the boost, represented by line 704 to cease until the Vout drops before restarting. As in the previous example illustrated in FIG. 6A, the output V4p5, represented by line 708, of the charge-pump increases to as high as 7.6 volts, which may result in damage to components of the power amplifier controller.

FIG. 7B depicts a graph illustrating a result of a power surge on the output of the charge-pump with overvoltage protection and with a current load present. The graph illustrated in FIG. 7B is similar to that in FIG. 7A and the lines that have not been changed have the same reference numerals. However, as illustrated by the line 720, the inclusion of the overvoltage protection control circuit 206 as disclosed herein prevents the V4p5 output from exceeding a set threshold, which in the illustrated example is about 6.1 or 6.2 volts.

Figure 8A:
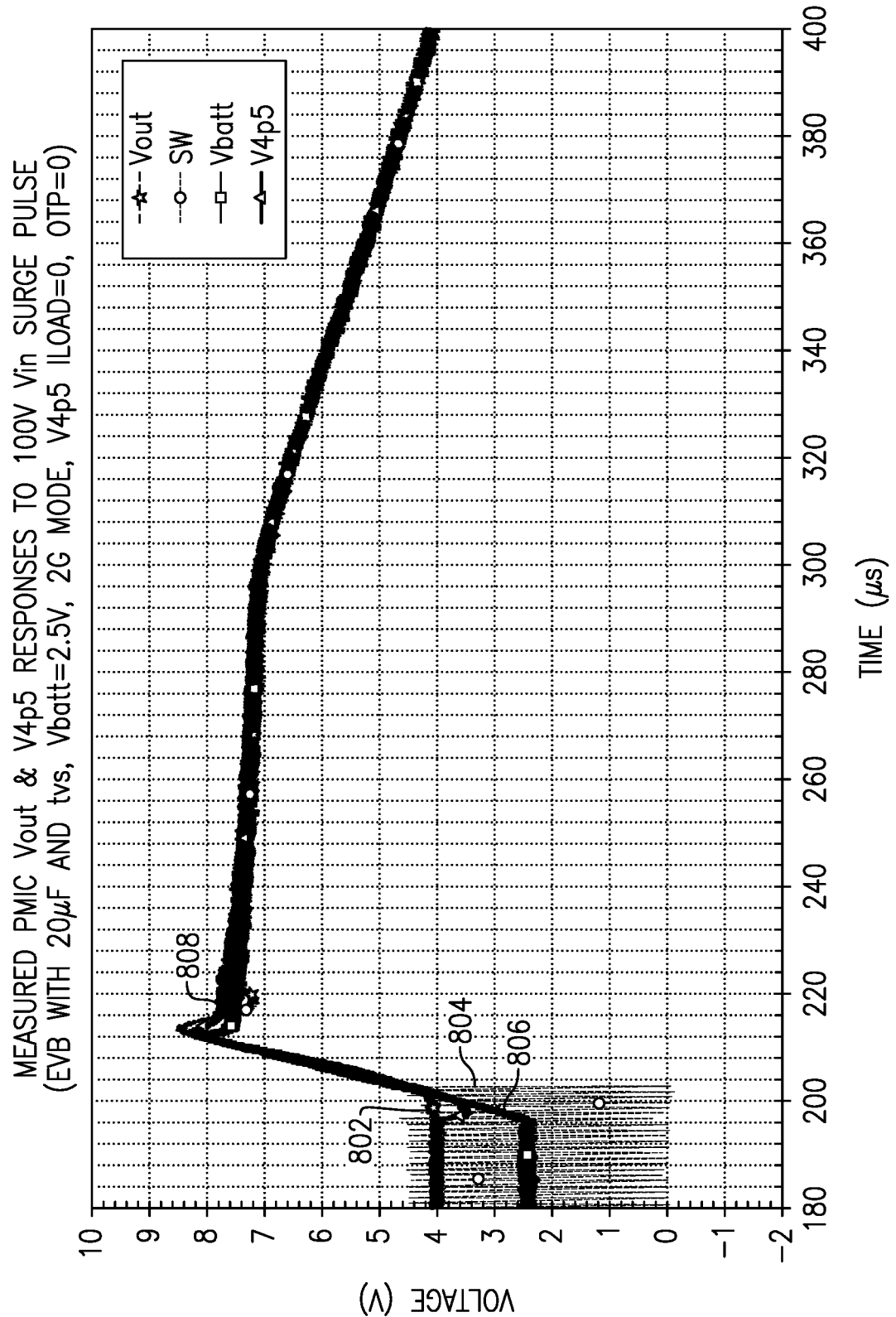
FIG. 8A depicts a graph illustrating a result of a power surge on the output of the charge-pump when operating in 2G mode and without overvoltage protection with no load present.

FIG. 8A depicts a graph illustrating a result of a power surge on the output of the charge-pump when operating in 2G mode and without overvoltage protection with no load present. In 2G mode, the output, Vout represented by line 802, of the boost converter 202 reflects the output, V4p5 represented by line 808, of the charge-pump 204. When the input voltage Vin, represented by line 806 increases due to a surge event, the outputs Vout and V4p5 similarly increase matching the input voltage. As illustrated by the line 804, the boost converter ceases switching when the Vin increases beyond the voltage threshold.

Figure 8B:
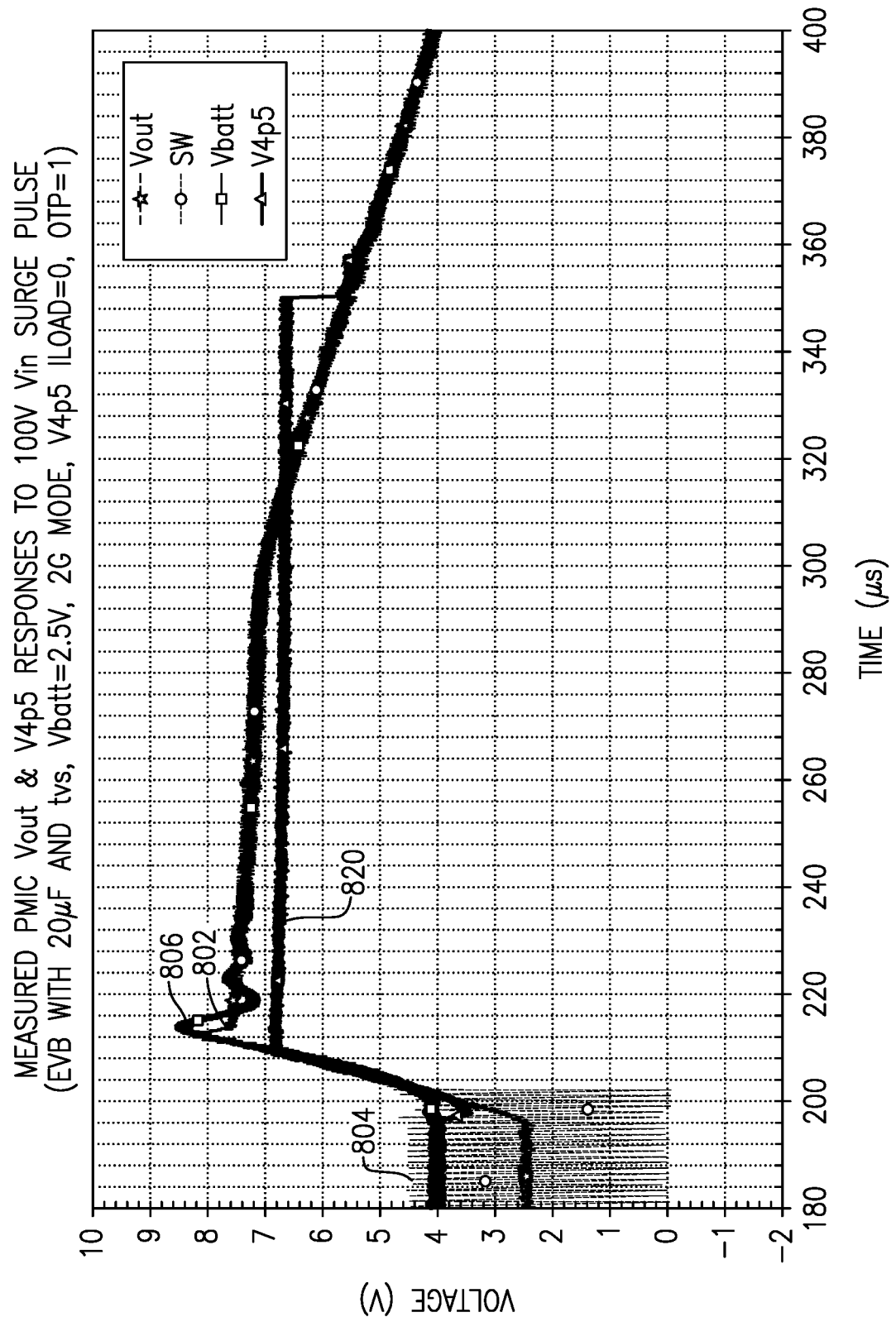
FIG. 8B depicts a graph illustrating a result of a power surge on the output of the charge-pump when operating in 2G mode and with overvoltage protection with no load present.

FIG. 8B depicts a graph illustrating a result of a power surge on the output of the charge-pump when operating in 2G mode and with overvoltage protection with no load present. The graph illustrated in FIG. 8B is similar to that in FIG. 8A and the lines that have not been changed have the same reference numerals. However, as illustrated by the line 820, the inclusion of the overvoltage protection control circuit 206 as disclosed herein prevents the V4p5 output from exceeding a set threshold, which in the illustrated example is about 6.8 volts when operating in 2G mode.

Figure 9A:
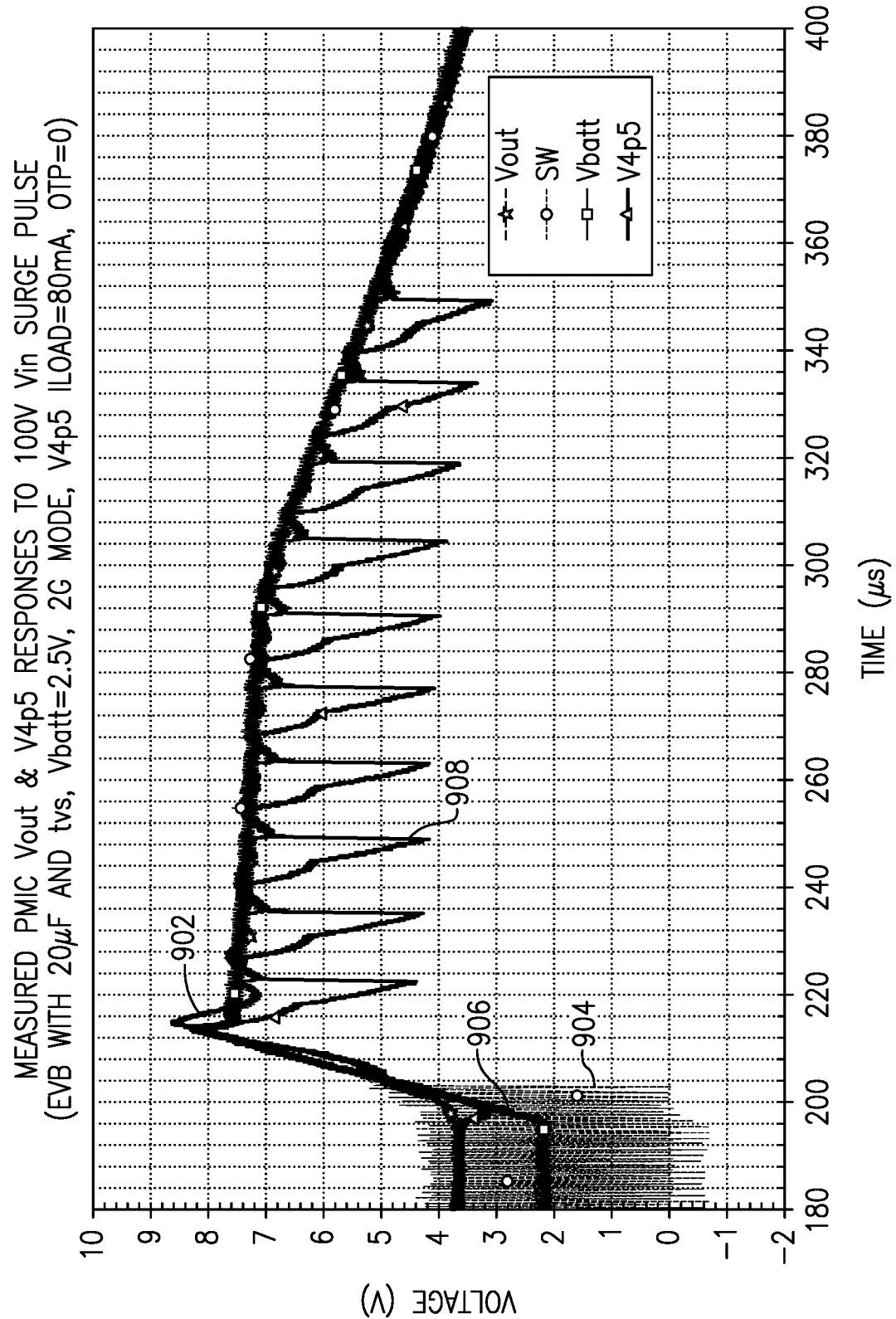
FIG. 9A depicts a graph illustrating a result of a power surge on the output of the charge-pump when operating in 2G mode and without overvoltage protection with a current load present.

FIG. 9A depicts a graph illustrating a result of a power surge on the output of the charge-pump when operating in 2G mode and without overvoltage protection with a current load present. In 2G mode, the output, Vout represented by line 902, of the boost converter 202 reflects the output, V4p5 represented by line 908, of the charge-pump 204. When the input voltage Vin, represented by line 906 increases due to a surge event, the outputs Vout and V4p5 similarly increase matching the input voltage. As illustrated by the line 904, the boost converter ceases switching when the Vin increases beyond the voltage threshold.

Figure 9B:
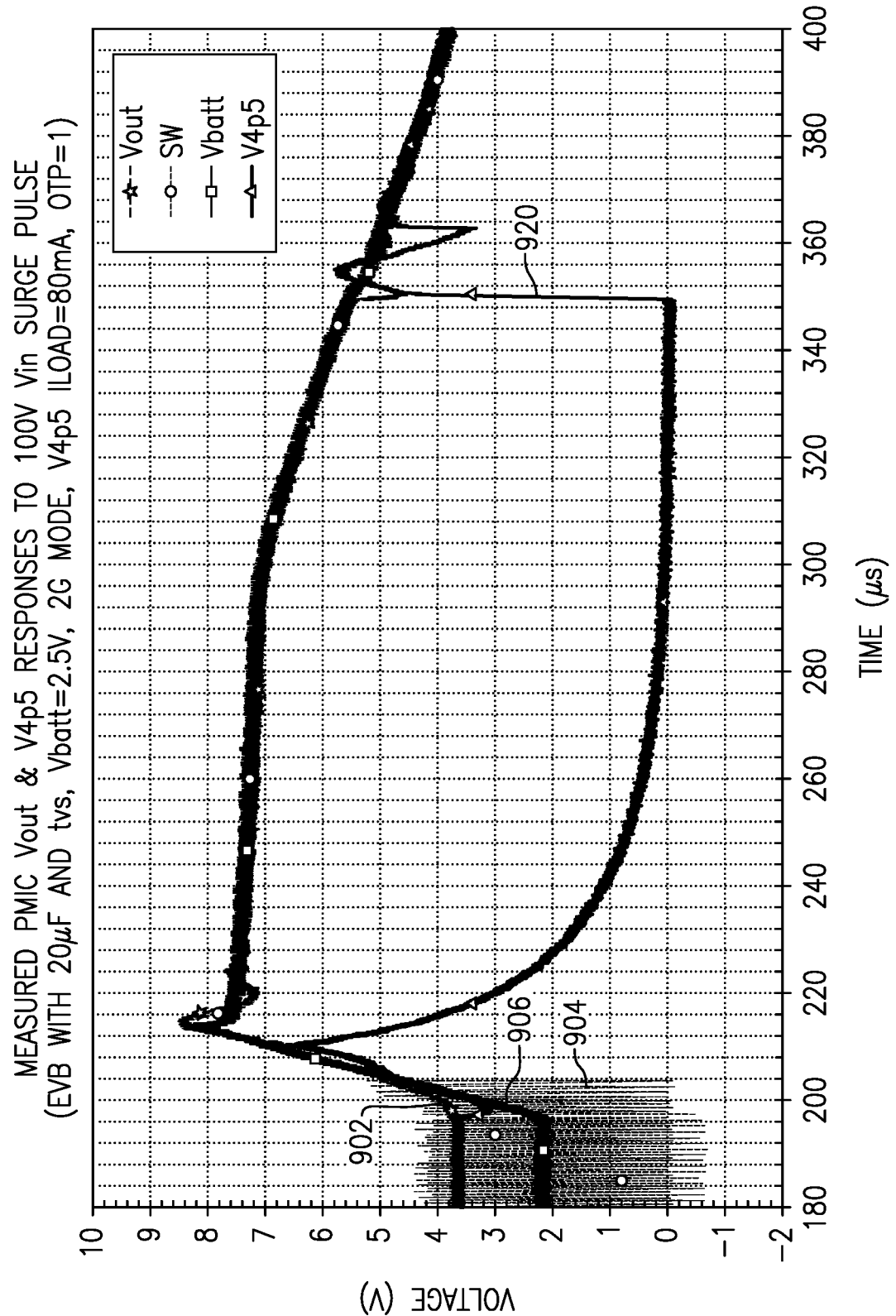
FIG. 9B depicts a graph illustrating a result of a power surge on the output of the charge-pump when operating in 2G mode and with overvoltage protection with a current load present.

FIG. 9B depicts a graph illustrating a result of a power surge on the output of the charge-pump when operating in 2G mode and with overvoltage protection with a current load present. The graph illustrated in FIG. 9B is similar to that in FIG. 9A and the lines that have not been changed have the same reference numerals. However, as illustrated by the line 920, the inclusion of the overvoltage protection control circuit 206 as disclosed herein prevents the V4p5 output from exceeding a set threshold, which in the illustrated example is about 6.5 volts when operating in 2G mode.

Additional Embodiments

Figure 10:
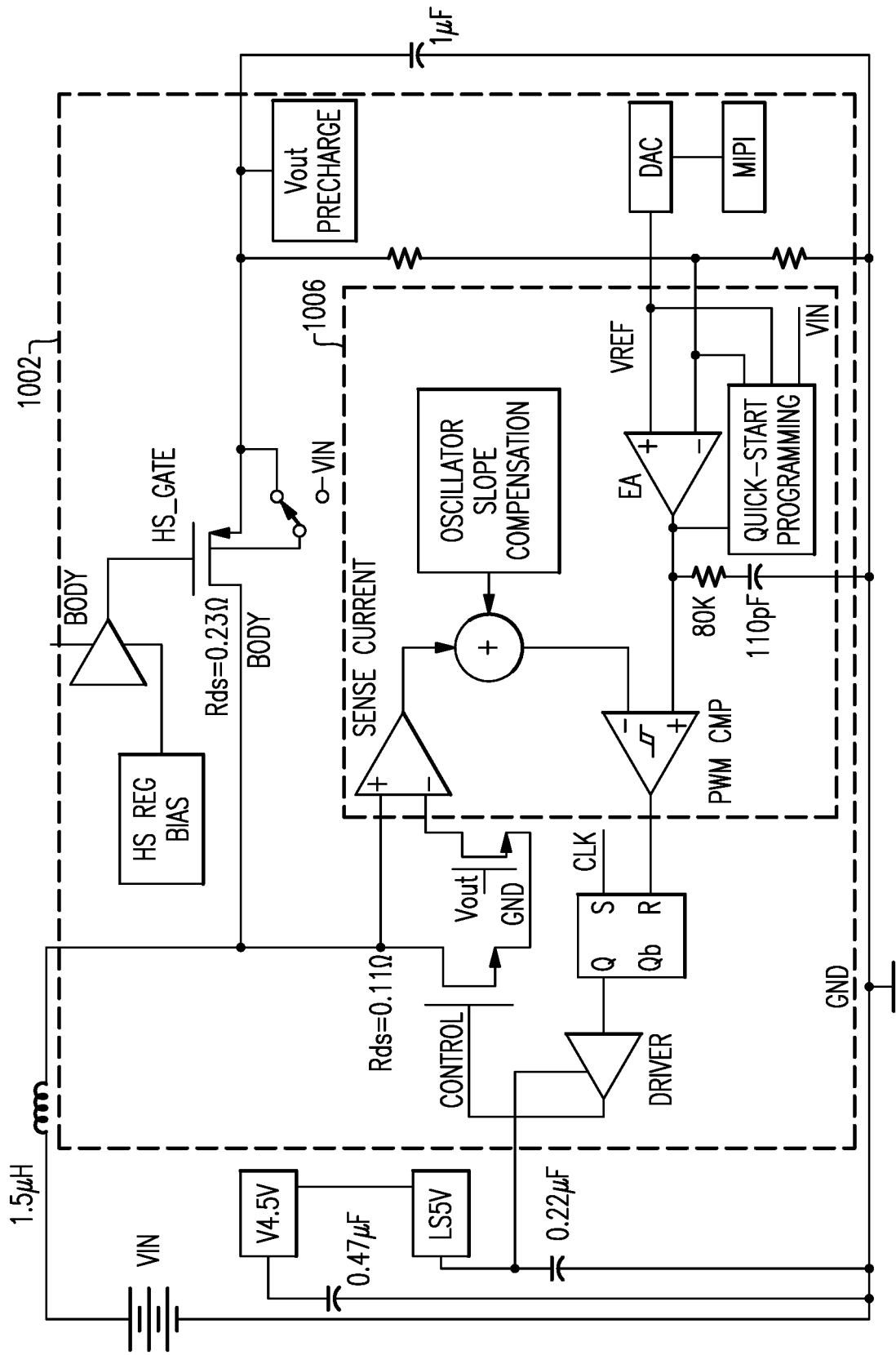
FIG. 10 illustrates a circuit diagram of an embodiment of a boost circuit that can be included as part of the power management integrated circuit.

FIG. 10 illustrates a circuit diagram of an embodiment of a boost circuit 1002 that can be included as part of the power management integrated circuit. The boost circuit 1002 illustrates the boost converter 202 in additional detail and may, in some embodiments, be used in place of the boost converter 202. Further, the boost circuit 1002 includes a programmable embodiment of the overvoltage protection control circuit 1006 that, in some embodiments, may be used in place of the overvoltage protection control circuit 206.

In certain embodiments disclosed herein, a power management integrated circuit may include a boost converter configured to supply a first voltage to a power amplifier when operating in a first mode, the power amplifier configured to support a first maximum voltage; a charge-pump circuit configured to supply a second voltage to a power amplifier controller of the power amplifier, the power amplifier controller configured to support a second maximum voltage, the second maximum voltage less than the first maximum voltage; and an overvoltage protection circuit that, when a power surge event occurs, configures the charge-pump circuit with a surge-protection configuration preventing the second voltage from exceeding the second maximum voltage.

Further, in certain embodiments, the overvoltage protection circuit includes a comparator configured to compare a bandgap voltage reference and an input voltage supplied to the power management integrated circuit to determine an occurrence of the power surge event. The charge-pump circuit may include a plurality of transistors in communication with an output pin of the charge-pump circuit. The overvoltage protection circuit may configure the charge-pump circuit with the surge protection configuration by disconnecting at least one of the plurality of transistors in communication with the output pin of the charge-pump circuit when the power surge event occurs.

In some embodiments, the charge-pump circuit includes a phase transistor between an input voltage pin of the charge-pump circuit and an external capacitor that is external to the charge-pump circuit. The overvoltage protection circuit may configure the charge-pump circuit with the surge protection configuration by disabling or turning off the phase transistor when the power surge event occurs.

With some implementations, the boost converter includes a sub-mode circuit that provides the second voltage supplied by the charge-pump circuit to the power amplifier when operating in a second mode. The sub-mode circuit may include a transistor between an output of the charge-pump circuit and an output of the boost converter, and the overvoltage protection circuit may disconnect the transistor when the power surge event occurs. The second mode may be a 2G operating mode or an operating mode associated with communicating over a 2G-based communication network.

Certain embodiments disclosed herein relate to a wireless device. The wireless device may include a power amplifier module including a power amplifier configured to support a first maximum voltage and a power amplifier controller configured to bias the power amplifier and to support a second maximum voltage that is less than the first maximum voltage; and a power management integrated circuit including a boost converter, a charge-pump circuit, and an overvoltage protection circuit, the boost converter configured to supply a first voltage to the power amplifier when the wireless device operates in a first mode, the charge-pump circuit configured to supply a second voltage to the power amplifier controller, and the overvoltage protection circuit configured to prevent the second voltage from exceeding the second maximum voltage during a power surge event by configuring the charge-pump circuit with a surge-protection configuration when the power surge event occurs.

In certain embodiments, the overvoltage protection circuit may determine the occurrence of the power surge event by comparing a bandgap voltage reference to an input reference supplied to the power management integrated circuit. Further, the overvoltage protection circuit may prevent the second voltage from exceeding the second maximum voltage by at least disconnecting at least one transistor in communication with an output pin of the charge-pump circuit when the power surge event occurs. In addition, the overvoltage protection circuit may prevent the second voltage from exceeding the second maximum voltage by at least disabling a phase transistor when the power surge event occurs. Moreover, the boost converter may include a sub-mode circuit that provides the second voltage supplied by the charge-pump circuit to the power amplifier when the wireless device operates in a second mode. The sub-mode circuit may include a transistor switch that provides an output of the charge-pump circuit as an output of the boost converter, and the overvoltage protection circuit may disconnect the transistor switch from the output of the boost converter when the power surge event occurs.

Certain embodiments disclosed herein relate to a method of performing surge protection of a wireless device. The method may include determining, by a power management integrated circuit, an operating mode of the wireless device, the power management integrated circuit including a boost converter configured to supply a first voltage to a power amplifier of a power amplifier module; determining a first overvoltage protection threshold of a charge-pump circuit based at least in part on the operating mode of the wireless device, the charge-pump circuit configured to supply a second voltage to a power amplifier controller of the power amplifier module; determining a first input voltage supplied to the power management integrated circuit of the wireless device at a first time period; determining that the first input voltage exceeds the first overvoltage protection threshold; and configuring the charge-pump circuit with a surge-protection configuration responsive to determining that the first input voltage exceeds the first overvoltage protection threshold.

In some embodiments, the first overvoltage protection threshold is lower than a maximum voltage supplied by the boost converter to the power amplifier when a power surge event is not occurring. Further, configuring the charge-pump circuit with the surge-protection configuration may include disconnecting at least one of a plurality of transistors in communication with an output pin of the charge-pump circuit.

Moreover, the method may further include determining a second overvoltage protection threshold of a charge-pump circuit based at least in part on the operating mode of the wireless device, the second overvoltage protection threshold lower than the first overvoltage protection threshold; determining a second input voltage supplied to the power management integrated circuit of the wireless device at a second time period that is later than the first time period; determining that the second input voltage does not exceed the second overvoltage protection threshold; and configuring the charge-pump circuit with a non-surge-protection configuration responsive to determining that the second input voltage does not exceed the second overvoltage protection threshold. In some embodiments, configuring the charge-pump circuit with the non-surge-protection configuration includes connecting at least one of a plurality of transistors in communication with an output pin of the charge-pump circuit, the at least one of the plurality of transistors previously disconnected responsive to the determination that the first input voltage exceeded the first overvoltage protection threshold.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power management integrated circuit comprising:
    a boost converter configured to supply a first voltage to a power amplifier, the power amplifier configured to support a first maximum voltage;
    a charge-pump circuit configured to supply a second voltage to a power amplifier controller of the power amplifier, the power amplifier controller configured to support a second maximum voltage, the second maximum voltage less than the first maximum voltage; and
    an overvoltage protection circuit that, when a power surge event occurs, configures the charge-pump circuit with a surge-protection configuration preventing the second voltage from exceeding the second maximum voltage, the overvoltage protection circuit including a comparator configured to compare a first bandgap reference voltage and an input voltage supplied to the power management integrated circuit to determine an occurrence of the power surge event, and the comparator further configured to compare a second bandgap voltage reference and the input voltage when the occurrence of the power surge event is detected to determine when the power surge event has ceased.

2. The power management integrated circuit of claim 1 wherein the second bandgap reference voltage is less than the first bandgap reference voltage.

3. The power management integrated circuit of claim 1 wherein the charge-pump circuit includes a plurality of transistors in communication with an output pin of the charge-pump circuit.

4. The power management integrated circuit of claim 3 wherein the overvoltage protection circuit configures the charge-pump circuit with the surge protection configuration by disconnecting at least one of the plurality of transistors in communication with the output pin of the charge-pump circuit when the power surge event occurs.

5. The power management integrated circuit of claim 4 wherein the overvoltage protection circuit configures the charge-pump circuit with a non-surge protection configuration when the power surge event ceases by reconnecting the at least one of the plurality of transistors in communication with the output pin of the charge-pump circuit.

6. The power management integrated circuit of claim 3 wherein a first transistor of the plurality of transistors connects an input voltage supplied to the power management integrated circuit to an output pin and a second transistor of the plurality of transistors connects the output pin to an external capacitor.

7. The power management integrated circuit of claim 1 wherein the charge-pump circuit includes a phase transistor between an input voltage pin of the charge-pump circuit and an external capacitor that is external to the charge-pump circuit.

8. The power management integrated circuit of claim 7 wherein the overvoltage protection circuit configures the charge-pump circuit with the surge protection configuration by disabling the phase transistor when the power surge event occurs.

9. A wireless device comprising:

a power amplifier module including a power amplifier configured to support a first maximum voltage and a power amplifier controller configured to bias the power amplifier and to support a second maximum voltage that is less than the first maximum voltage; and a power management integrated circuit including a boost converter, a charge-pump circuit, and an overvoltage protection circuit, the boost converter configured to supply a first voltage to the power amplifier, the charge-pump circuit configured to supply a second voltage to the power amplifier controller, and the overvoltage protection circuit configured to prevent the second voltage from exceeding the second maximum voltage during a power surge event by configuring the charge-pump circuit with a surge-protection configuration when the power surge event occurs, the overvoltage protection circuit configured to determine the occurrence of the power surge event by comparing a first bandgap reference voltage to an input voltage supplied to the power management integrated circuit, and the overvoltage protection circuit further configured to determine that the occurrence of the power surge event has ceased by comparing a second bandgap reference voltage to the input voltage.

10. The wireless device of claim 9 wherein the second bandgap voltage is less than the first bandgap voltage.

11. The wireless device of claim 9 wherein the overvoltage protection circuit prevents the second voltage from exceeding the second maximum voltage by at least disconnecting at least one transistor in communication with an output pin of the charge-pump circuit when the power surge event occurs.

12. The wireless device of claim 9 wherein the overvoltage protection circuit prevents the second voltage from exceeding the second maximum voltage by at least disabling a phase transistor when the power surge event occurs.

13. A method of performing surge protection of a wireless device, the method comprising:

determining, by a power management integrated circuit, an operating mode of the wireless device, the power management integrated circuit including a boost converter configured to supply a first voltage to a power amplifier of a power amplifier module;

determining a first overvoltage protection threshold of a charge-pump circuit based at least in part on the operating mode of the wireless device, the charge-pump circuit configured to supply a second voltage to a power amplifier controller of the power amplifier module;

determining a first input voltage supplied to the power management integrated circuit of the wireless device at a first time period;

determining that the first input voltage exceeds the first overvoltage protection threshold;

configuring the charge-pump circuit with a surge-protection configuration responsive to determining that the first input voltage exceeds the first overvoltage protection threshold;

determining a second overvoltage protection threshold of a charge-pump circuit based at least in part on the operating mode of the wireless device;

determining a second input voltage supplied to the power management integrated circuit of the wireless device at a second time period that is later than the first time period;

determining that the second input voltage does not exceed the second overvoltage protection threshold; and configuring the charge-pump circuit with a non-surge-protection configuration responsive to determining that the second input voltage does not exceed the second overvoltage protection threshold.

14. The method of claim 13 wherein the first overvoltage protection threshold is lower than a maximum voltage supplied by the boost converter to the power amplifier when a power surge event is not occurring.

15. The method of claim 13 wherein configuring the charge-pump circuit with the surge-protection configuration includes disconnecting at least one of a plurality of transistors in communication with an output pin of the charge-pump circuit.

16. The method of claim 13 wherein the second overvoltage protection threshold is lower than the first overvoltage protection threshold.

17. The method of claim 13 wherein configuring the charge-pump circuit with the non-surge-protection configuration includes connecting at least one of a plurality of transistors in communication with an output pin of the charge-pump circuit, the at least one of the plurality of transistors previously disconnected responsive to the determination that the first input voltage exceeded the first overvoltage protection threshold.

* * * * *